US010770560B2

(12) United States Patent
Yim et al.

(10) Patent No.: US 10,770,560 B2

(45) Date of Patent: Sep. 8, 2020

(54) SEMICONDUCTOR DEVICES

(71) Applicant: Samsung Electronics Co., Ltd., Suwon-si (KR)

(72) Inventors: Jeong Hyuk Yim, Seoul (KR); Kug Hwan Kim, Hwaseong-si (KR); Wan Don Kim, Seongnam-si (KR); Jung Min Park, Seoul (KR); Jong Ho Park, Suwon-si (KR); Byoung Hoon Lee, Suwon-si (KR); Yong Ho Ha, Hwaseong-si (KR); Sang Jin Hyun, Suwon-si (KR); Hye Ri Hong, Yongin-si (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 8 days.

(21) Appl. No.: 16/214,537

(22) Filed: Dec. 10, 2018

(65) Prior Publication Data

US 2019/0355825 A1 Nov. 21, 2019

(30) Foreign Application Priority Data

May 18, 2018 (KR) ........................ 10-2018-0057093

(51) Int. Cl.

*H01L 29/423* (2006.01)
*H01L 29/51* (2006.01)

(Continued)

(52) U.S. Cl.

CPC ...... *H01L 29/42372* (2013.01); *H01L 27/092* (2013.01); *H01L 29/4236* (2013.01);

(Continued)

(58) Field of Classification Search

CPC ............... H01L 27/0924; H01L 27/088; H01L 29/42376; H01L 29/42372; H01L 29/41;

(Continued)

(56) References Cited

U.S. PATENT DOCUMENTS 8,704,294 B2 4/2014 Liao et al.
9,105,497 B2 8/2015 Hong et al.

(Continued)

FOREIGN PATENT DOCUMENTS

KR 10-2019-0059665 A 5/2019

*Primary Examiner* — Hsien Ming Lee

(74) *Attorney, Agent, or Firm* — Muir Patent Law, PLLC

(57) ABSTRACT

A semiconductor device according to an example embodiment of the present inventive concept includes a substrate having a first region and a second region horizontally separate from the first region; a first gate line in the first region, the first gate line including a first lower work function layer and a first upper work function layer disposed on the first lower work function layer; and a second gate line including a second lower work function layer in the second region, the second gate line having a width in a first, horizontal direction equal to or narrower than a width of the first gate line in the first direction, wherein an uppermost end of the first upper work function layer and an uppermost end of the second lower work function layer are each located at a vertical level higher than an uppermost end of the first lower work function layer with respect to a second direction perpendicular to the first direction.

20 Claims, 18 Drawing Sheets

(51) Int. Cl.

| | |
|---|---|
| ***H01L 29/66*** | (2006.01) |
| ***H01L 27/092*** | (2006.01) |
| ***H01L 29/78*** | (2006.01) |
| ***H01L 29/49*** | (2006.01) |

(52) U.S. Cl.
CPC ........ *H01L 29/4975* (2013.01); *H01L 29/517* (2013.01); *H01L 29/66545* (2013.01); *H01L 29/78* (2013.01)

(58) Field of Classification Search
CPC ......... H01L 29/66484; H01L 29/78645; H01L 29/7831; H01L 21/28593; H01L 21/28587; H01L 21/823437; H01L 21/823456; H01L 2924/13092
See application file for complete search history.

(56) References Cited

U.S. PATENT DOCUMENTS

| | | | | |
|---|---|---|---|---|
| 9,230,864 | B1 * | 1/2016 | Lu | H01L 29/7831 |
| 9,293,551 | B2 | 3/2016 | Fan et al. | |
| 9,640,438 | B2 | 5/2017 | Zhu et al. | |
| 2016/0042954 | A1 | 2/2016 | Sung et al. | |
| 2016/0064378 | A1 * | 3/2016 | Kwon | H01L 21/82345 257/401 |
| 2016/0225868 | A1 | 8/2016 | Kim et al. | |
| 2017/0162575 | A1 | 6/2017 | Li | |
| 2019/0157410 | A1 * | 5/2019 | Yim | H01L 29/66545 |

* cited by examiner

SEMICONDUCTOR DEVICES

CROSS-REFERENCE TO RELATED APPLICATION

This application claims priority to Korean Patent Application No. 10-2018-0057093 filed on May 18, 2018 in the Korean Intellectual Property Office, the disclosure of which is incorporated by reference herein in its entirety.

BACKGROUND

1. Field

The present inventive concept according to exemplary embodiments relates to a semiconductor device.

2. Description of Related Art

Electronic devices are becoming more compact with higher performance, according to the rapid development of the electronics industry and the demands of users. Therefore, semiconductor devices used in electronic devices may be required to include transistors that are capable of sustained scaling down but that also provide various operating voltages.

SUMMARY

An aspect of the present inventive concept is to provide a semiconductor device including transistors having various threshold voltages, in particular, a p-type transistor having a low threshold voltage.

According to an example embodiment of the present inventive concept, a semiconductor device includes a substrate having a first region and a second region horizontally separate from the first region; a first gate line in the first region, the first gate line including a first lower work function layer and a first upper work function layer disposed on the first lower work function layer; and a second gate line including a second lower work function layer in the second region, the second gate line having a width in a first, horizontal direction equal to or narrower than a width of the first gate line in the first direction, wherein an uppermost end of the first upper work function layer and an uppermost end of the second lower work function layer are each located at a vertical level higher than an uppermost end of the first lower work function layer with respect to a second direction perpendicular to the first direction.

According to an example embodiment of the present inventive concept, a semiconductor device includes a substrate having a first region and a second region; a first gate line disposed in the first region, and including a first gate insulating layer, a first lower work function layer, and a first upper work function layer, stacked in sequence; and a second gate line disposed in the second region, and including a second gate insulating layer and a second lower work function layer, stacked in sequence, wherein, in the first gate line, the first upper work function layer is disposed to cover an uppermost end of the first lower work function layer, wherein a height of the second gate insulating layer in a direction perpendicular to an upper surface of the substrate is higher than a height of the first gate insulating layer in the direction perpendicular to the upper surface of the substrate, and wherein a height of the second lower work function layer in the direction perpendicular to the upper surface of the substrate is higher than a height of the first lower work function layer in the direction perpendicular to the upper surface of the substrate.

According to an example embodiment of the present inventive concept, a semiconductor device includes a substrate having a first region and a second region; a first gate line in the first region, the first gate line including a first lower work function layer and a first upper work function layer disposed on the first lower work function layer; a second gate line including a second lower work function layer in the second region, the second gate line having a width in a first direction equal to or narrower than a width of the first gate line in the first direction; and a gate capping layer disposed on the second gate line and formed of an insulating material, wherein each of an uppermost end of the first upper work function layer and an uppermost end of the second lower work function layer is at a level higher than an uppermost end of the first lower work function layer with respect to a second direction perpendicular to the first direction, and wherein the gate capping layer has a protrusion filling an internal space of the second lower work function layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
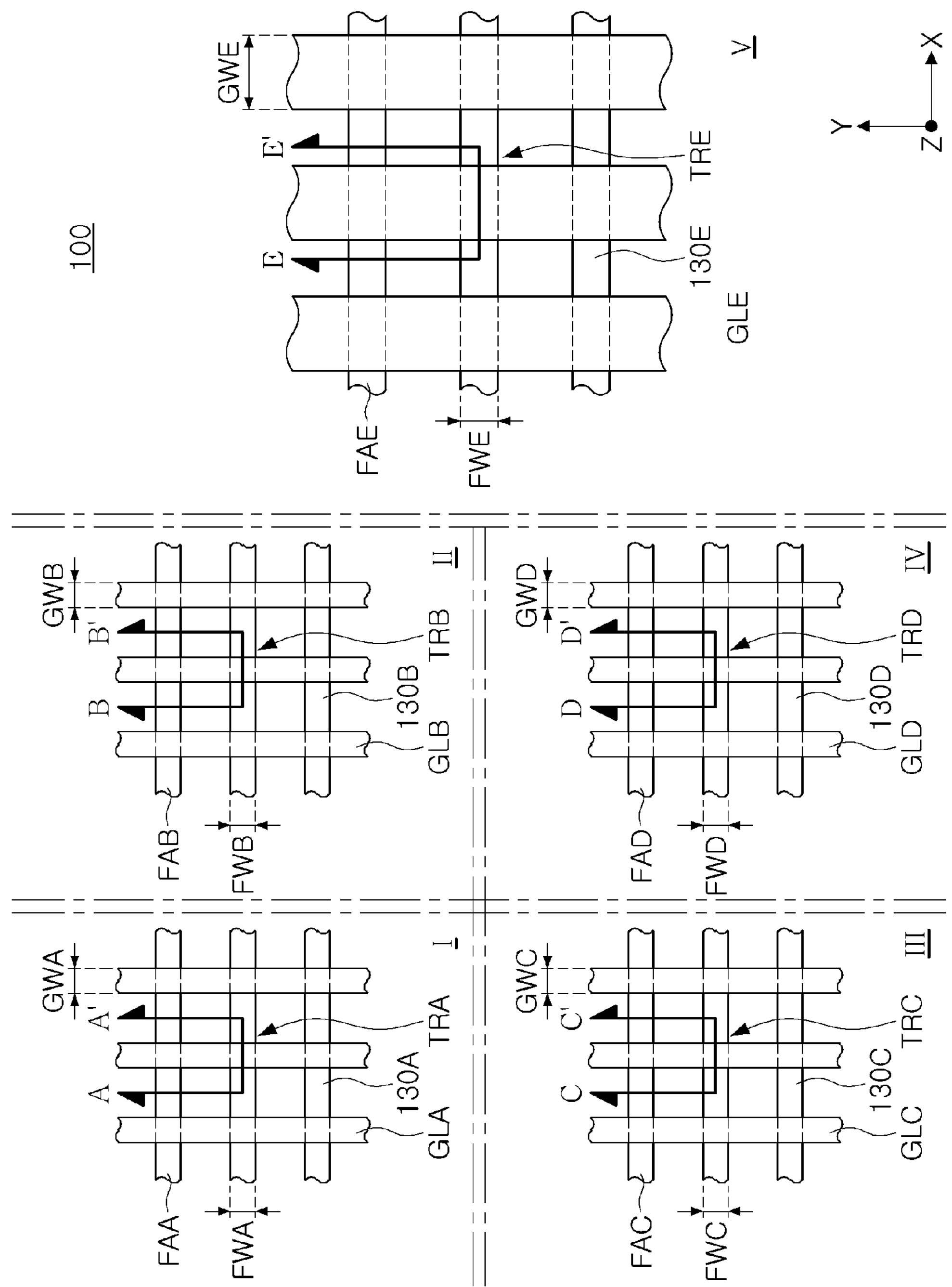
FIG. 1 is a layout plan view illustrating a main structure of a semiconductor device including a transistor according to example embodiments of the present inventive concept.

FIG. 1 is a layout plan view illustrating a main structure of a semiconductor device including a transistor according to example embodiments of the present inventive concept.

Referring to FIG. 1, a semiconductor device 100 may include a first region I, a second region II, a third region III, a fourth region IV, and a fifth region V.

A first transistor TRA, a second transistor TRB, a third transistor TRC, a fourth transistor TRD, and a fifth transistor TRE may be arranged in the first region I, the second region II, the third region III, the fourth region IV, and the fifth region V, respectively. The first to fifth transistors TRA, TRB, TRC, TRD, and TRE may be a Fin Field-effect transistor FinFET.

The first region I may include a plurality of first fin-type active regions FAA extending in parallel to each other in a first direction (an X direction), and a plurality of first gate lines GLA extending in a second direction (a Y direction) intersecting the plurality of first fin-type active regions FAA on the plurality of first fin-type active regions FAA. The first direction (the X direction) and the second direction (the Y direction) are perpendicular to each other in the same plane, and may be described as horizontal directions. The first transistors TRA may be formed on portions in which the plurality of first fin-type active regions FAA and the plurality of first gate lines GLA intersect each other, respectively. The first fin-type active region FAA may have a first fin width FWA in the second direction, and the first gate line GLA may have a first gate width GWA in the first direction.

The second region II may include a plurality of second fin-type active regions FAB extending in parallel to each other in a first direction (an X direction), and a plurality of second gate lines GLB extending in a second direction (a Y direction) intersecting the plurality of second fin-type active regions FAB on the plurality of second fin-type active regions FAB. The second transistors TRB may be formed on portions in which the plurality of second fin-type active regions FAB and the plurality of second gate lines GLB intersect each other, respectively. The second fin-type active region FAB may have a second fin width FWB in the second direction, and the second gate line GLB may have a second gate width GWB in the first direction.

The third region III may include a plurality of third fin-type active regions FAC extending in parallel to each other in a first direction (an X direction), and a plurality of third gate lines GLC extending in a second direction (a Y direction) intersecting the plurality of third fin-type active regions FAC on the plurality of third fin-type active regions FAC. The third transistors TRC may be formed on portions in which the plurality of third fin-type active regions FAC and the plurality of third gate lines GLC intersect each other, respectively. The third fin-type active region FAC may have a third fin width FWC in the second direction, and the third gate line GLC may have a third gate width GWC in the first direction.

The fourth region IV may include a plurality of fourth fin-type active regions FAD extending in parallel to each other in a first direction (an X direction), and a plurality of fourth gate lines GLD extending in a second direction (a Y direction) intersecting the plurality of fourth fin-type active regions FAD on the plurality of fourth fin-type active regions FAD. The fourth transistors TRD may be formed on portions in which the plurality of fourth fin-type active regions FAD and the plurality of fourth gate lines GLD intersect each other, respectively. The fourth fin-type active region FAD may have a fourth fin width FWD in the second direction, and the fourth gate line GLD may have a fourth gate width GWD in the first direction.

The fifth region V may include a plurality of fifth fin-type active regions FAE extending in parallel to each other in a first direction (an X direction), and a plurality of fifth gate lines GLE extending in a second direction (a Y direction) intersecting the plurality of fifth fin-type active regions FAE on the plurality of fifth fin-type active regions FAE. The fifth transistors TRE may be formed on portions in which the plurality of fifth fin-type active regions FAE and the plurality of fifth gate lines GLE intersect each other, respectively. The fifth fin-type active region FAE may have a fifth fin width FWE in the second direction, and the fifth gate line GLE may have a fifth gate width GWE in the first direction.

Each of the first to fourth fin widths FWA, FWB, FWC, and FWD may have a lower value than the fifth fin width FWE, and each of the first to fourth gate widths GWA, GWB, GWC, and GWD may have a lower value than the fifth gate width GWE. Each of the first to fourth fin widths FWA, FWB, FWC, and FWD may have the same value for each other, and each of the first to fourth gate widths GWA, GWB, GWC, and GWD may have the same value for each other. A portion of the first to fourth gate widths GWA, GWB, GWC, and GWD may have lower values than the others. For example, the fourth gate width GWD may be narrower than each of the first to third gate widths GWA, GWB, and GWC.

Each of the first transistor TRA and the second transistor TRB may be a metal-oxide-semiconductor field-effect transistor MOSFET of a first conductivity type (e.g., an n-type), and each of the third transistor TRC and the fourth transistor TRD may be a MOSFET of a second conductivity type (e.g., a p-type) that may be different from the first conductivity type. The fifth transistor (TRE) may be a p-type MOSFET.

An operating voltage (threshold voltage) of the first transistor TRA may have a lower value than an operating voltage (threshold voltage) of the second transistor TRB, and an operating voltage (threshold voltage) of the third transistor TRC may have a higher value than an operating voltage (threshold voltage) of the fourth transistor TRD. The operating voltage (threshold voltage) of each of the first to fourth transistors TRA, TRB, TRC, and TRD may have a lower value than the operating voltage (threshold voltage) of the fifth transistor TRE. The operating voltages (threshold voltages) of the first to fifth transistors TRA, TRB, TRC, TRD, and TRE may be compared with each other by respective absolute values of the operating voltages (threshold voltages) of the first to fifth transistors TRA, TRB, TRC, TRD, and TRE.

In FIG. 1, a plurality of first to fifth fin-type active regions FAA, FAB, FAC, FAD, and FAE extending in a first direction (an X direction), and a plurality of first to fifth gate lines GLA, GLB, GLC, GLD, and GLE extending in a second direction (a Y direction) are exemplarily illustrated. The technical idea of the present inventive concept is not limited to those illustrated in FIG. 1. Extension directions of a plurality of first to fifth fin-type active regions FAA, FAB, FAC, FAD, and FAE, and extension directions of a plurality of first to fifth gate lines GLA, GLB, GLC, GLD, and GLE may be variously selected.

Figure 2:
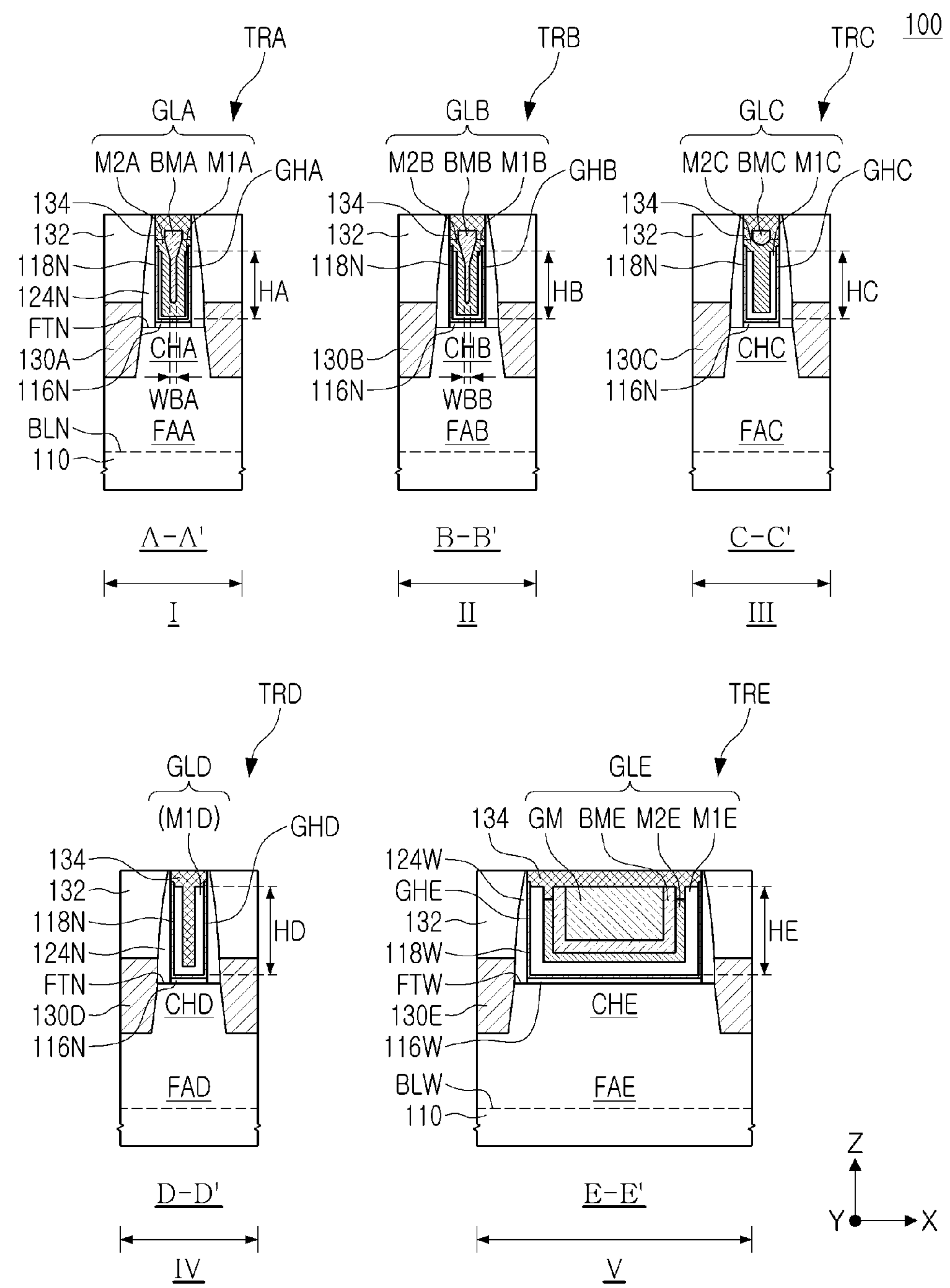
FIG. 2 is a cross-sectional view illustrating a semiconductor device according to an example embodiment of the present inventive concept.

FIG. 2 is a cross-sectional view illustrating a semiconductor device according to an example embodiment of the present inventive concept. FIG. 2 illustrates a cross-sectional view regarding positions corresponding to lines A-A', B-B', C-C', D-D', and E-E' in FIG. 1.

A semiconductor device 100 may include first to fifth regions I, II, III, IV, and V.

A first transistor TRA, a second transistor TRB, a third transistor TRC, a fourth transistor TRD, and a fifth transistor TRE may be arranged in the first region I, the second region II, the third region III, the fourth region IV, and the fifth region V, respectively.

The semiconductor device 100 may include first to fifth fin-type active regions FAA, FAB, FAC, FAD, and FAE protruding from a substrate 110 in the first to fifth regions I, II, III, IV, and V of the substrate 110.

A first channel region CHA of the first fin-type active region FAA and a second channel region CHB of the second fin-type active region FAB may be regions doped with an impurity (e.g., a carrier impurity) of a first conductivity type. A third channel region CHC of the third fin-type active region FAC and a fourth channel region CHD of the fourth fin-type active region FAD may be regions doped with an impurity (e.g., a carrier impurity) of a second conductivity type that is different from the first conductivity type. A fifth channel region CHE of the fifth fin-type active region FAE may be a region doped with the impurity of the second conductivity type, but is not limited thereto. For example, the first conductivity type may be a p-type, and the second conductivity type may be an n-type. As used in this disclosure, a carrier impurity refers to impurities adding charge carriers (e.g., holes or electrons) with respect to an intrinsic semiconductor.

The first to fifth channel regions CHA, CHB, CHC, CHD, and CHE may protrude as a fin shape along a direction (a Z direction) perpendicular to a main surface (an X-Y plane). Each of the first to fourth channel regions CHA, CHB, CHC, and CHD may be covered with a first interface film 116N, and the fifth channel region CHE may be covered with a second interface film 116W. A first gate insulating layer 118N may be present on the first interface film 116N, and first to fourth gate lines GLA, GLB, GLC, and GLD may cover the first to fourth channel regions CHA, CHB, CHC, and CHD and may extend in directions intersecting first to fourth fin-type active regions FAA, FAB, FAC, and FAD, respectively, in the first to fourth regions I, II, III, and IV. A second gate insulating layer 118W may be present on the second interface film 116W, and a fifth gate line GLE may cover the fifth channel region CHE and may extend in a direction intersecting a fifth fin-type active region FAE, in the fifth region V.

Each of the first to fourth gate lines GLA, GLB, GLC, and GLD may have a first width (WGN in FIG. 4), a width of a space defined by a first gate insulating layer 118N, in directions (X directions) perpendicular to extension directions (Y directions) of each of the first to fourth gate lines GLA, GLB, GLC, and GLD. The fifth gate line GLE may have a second width (WGW in FIG. 4), a width of a space defined by a second gate insulating layer 118W, in a direction (X direction) perpendicular to an extension direction (a Y direction) of the fifth gate line GLE. The first width WGN may be a gate length of each of a first transistor TRA, a second transistor TRB, a third transistor TRC, and a fourth transistor TRD. The second width WGW may be a gate length of a fifth transistor TRE. That is, the second width WGW, the gate length of the fifth transistor TRE, may have a greater value than the first width WGN, the gate length of each of the first transistor TRA, the second transistor TRB, the third transistor TRC, and the fourth transistor TRD.

The first and second interface films 116N and 116W may be formed of a low dielectric material film having a dielectric constant of about 9 or less, for example, a silicon oxide film, a silicon oxynitride film, or a combination thereof.

Terms such as "about," or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The first and second gate insulating layers 118N and 118W may be formed of a silicon oxide film, a high dielectric film, or a combination thereof. The high dielectric film may be formed of a material having a dielectric constant larger than that of the silicon oxide film. The first and second gate insulating layers 118N and 118W may have a dielectric constant of about 10 to 25. According to exemplary embodiments, the dielectric constant of the first gate insulating layer 118N may be higher than the dielectric constant of the first interface film 116N and the dielectric constant of the second gate insulating layer 118W may be higher than the dielectric constant of the second interface film 116W. According to exemplary embodiments, the dielectric constant of the second gate insulating layer 118W may be higher than the dielectric constant of the first interface film 116N and the dielectric constant of the first gate insulating layer 118N may be higher than the dielectric constant of the second interface film 116W. The first and second gate insulating layers 118N and 118W may be formed of hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, erbium oxide, dysprosium oxide, gadolinium oxide, aluminum oxide, lead scandium tantalum oxide, lead zinc niobate, or a combination thereof, but are not limited thereto.

An uppermost end of the first gate insulating layer 118N in the fourth region IV may be located on a level, in a direction perpendicular (a Z direction, or vertical direction) to an upper surface of the substrate 110, higher than an uppermost end of the first gate insulating layer 118N in each of the first to third region I, II, and III. The uppermost end of the first gate insulating layer 118N in the fourth region IV and an uppermost end of the second gate insulating layer 118W in the fifth region V may be located on approximately the same level in a direction perpendicular (a Z direction) to an upper surface of the substrate 110.

The uppermost portion of the first gate insulating layer 118N in each of the first to fourth regions I, II, III, and IV may have a level, in a direction perpendicular (a Z direction) to an upper surface of the substrate 110, higher than an uppermost end of each of first to fourth lower work function layers M1A, M1B, M1C, and M1D (see, e.g., FIG. 2). The uppermost end of the second gate insulating layer 118W in the fifth region V may have a level, in a direction perpendicular (a Z direction) to an upper surface of the substrate 110, higher than an uppermost end of a fifth lower work function layer M1E (see, e.g., FIG. 2).

The first gate line GLA may include a first lower work function layer M1A, a first upper work function layer M2A, and a first conductive barrier layer BMA. The second gate line GLB may include a second lower work function layer M1B, a second upper work function layer M2B, and a second conductive barrier layer BMB. The third gate line GLC may include a third lower work function layer M1C, a third upper work function layer M2C, and a third conductive barrier layer BMC. The fourth gate line GLD may include a fourth lower work function layer M1D. The fifth gate line GLE may include a fifth lower work function layer M1E, a fifth upper work function layer M2E, a fifth conductive barrier layer BME, and a gap fill metal layer GM.

The first to fifth lower work function layers M1A, M1B, M1C, M1D, and M1E may control work functions. The work functions of the first to fifth gate lines GLA, GLB, GLC, GLD, and GLE may be controlled according to a thickness of each of the first to fifth lower work function layers M1A, M1B, M1C, M1D, and M1E. The first to fifth lower work function layers M1A, M1B, M1C, M1D, and M1E may be formed of a conductive material having a work function of 4.5 eV or higher. The first to fifth lower work function layers M1A, M1B, M1C, M1D, and M1E may be formed of, for example, a conductive material that does not contain aluminum Al. The first to fifth lower work function layers M1A, M1B, M1C, M1D, and M1E may be formed of, for example, TiN, TaN, W, WCN, or a combination thereof.

The first to fourth lower work function layers M1A, M1B, M1C, and M1D may be conformally formed on the first gate insulating layer 118N not to completely fill the inside of first to fourth gate spaces GHA, GHB, GHC, and GHD, respectively. The fifth lower work function layer M1E may be conformally formed on the second gate insulating layer 118W not to completely fill the inside of a fifth gate space GHE. The first to fifth lower work function layers M1A, M1B, M1C, M1D, and M1E may have first to fifth thicknesses, respectively. The first thickness of the first lower work function layer M1A in a first direction (an X direction) may have a lower value than the second thickness of the second lower work function layer M1B in the first direction (an X direction). The second thickness of the second lower work function layer M1B in a first direction (an X direction) may have a lower value than the third thickness of the third lower work function layer M1C in the first direction (an X direction). The third thickness of the third lower work function layer M1C in a first direction (an X direction) may have a lower value than the fourth thickness of the fourth lower work function layer M1D in the first direction (an X direction). The fifth thickness of the fifth lower work function layer M1E in a first direction (an X direction) may have a higher value than the fourth thickness of the fourth lower work function layer M1D in the first direction (an X direction), but is not limited thereto.

Heights from a lowermost end to an uppermost end of the first to fifth lower work function layers M1A, M1B, M1C, M1D, and M1E may be first to fifth heights HA, HB, HC, HD, and HE, respectively. The first to third heights HA, HB, and HC may have approximately the same value. The fourth and fifth heights HD and HE may have approximately the same value. The fourth and fifth heights HD and HE may have values higher than each of the first to third heights HA, HB, and HC.

The first to fifth lower work function layers M1A, M1B, M1C, M1D, and M1E may have a U-shaped cross-section on a plane (an X-Y plane) perpendicular to an extension direction (a Y direction) of the first to fifth gate lines GLA, GLB, GLC, GLD, and GLE.

The first to third upper work function layers M2A, M2B, and M2C may cover the first to third lower work function layers M1A, M1B, and M1C, respectively. The fifth upper work function layer M2E may cover the fifth lower work function layer M1E. The first to third upper work function layers M2A, M2B, and M2C and the fifth upper work function layer M2E may control work functions. The first to third upper work function layers M2A, M2B, and M2C and the fifth upper work function layer M2E may be formed of the same material for each other. For example, each of the first to third upper work function layers M2A, M2B, and M2C and the fifth upper work function layer M2E may have the same material composition. The first to third upper work function layers M2A, M2B, and M2C and the fifth upper work function layer M2E may be formed of a conductive material having a work function lower than each of the first to fifth lower work function layers M1A, M1B, M1C, M1D, and M1E. The first to third upper work function layers M2A, M2B, and M2C and the fifth upper work function layer M2E may be formed of a conductive material having a work function of less than 4.5 eV. The first to third upper work function layers M2A, M2B, and M2C and the fifth upper work function layer M2E may be formed of, for example, an alloy containing aluminum Al, a conductive metal carbide containing Al, a conductive metal nitride containing Al, or a combination thereof. In one embodiment, The first to third upper work function layers M2A, M2B, and M2C and the fifth upper work function layer M2E may be formed of TiAl, TiAlC, TiAlN, or a combination thereof.

The uppermost end of each of the first to third upper work function layers M2A, M2B, and M2C may be located at substantially the same level. The uppermost end of each of the first to third upper work function layers M2A, M2B, and M2C may be located on a level in a direction perpendicular to an upper surface of the substrate (a Z direction) higher than the uppermost end of each of the first to third lower work function layers M1A, M1B, and M1C. The uppermost end of the fifth upper work function layer M2E may be located on a level in a direction perpendicular to an upper surface of the substrate (a Z direction) lower than the uppermost end of the fifth lower work function layer M1E.

The first to third upper work function layers M2A, M2B and M2C may fill at least a portion of an internal space of the U-shape of each of the first to third lower work function layers M1A, M1B, and M1C, and may extend upward than the uppermost end of each of the first to third lower work function layers M1A, M1B, and M1C. In one embodiment, the third upper work function layer M2C may fill all of an internal space of the U-shape of the third lower work function layer M1C, and may extend upward than the uppermost end of the third lower work function layer M1C.

Each of the first to third upper work function layers M2A, M2B, and M2C may have a U-shaped cross-section on a plane (an X-Z plane) perpendicular to extension directions (Y directions) of the first to third gate lines GLA, GLB, and GLC.

The fifth upper work function layer M2E may fill a portion of an internal space of the U-shape of the fifth lower work function layer M1E, and the uppermost end of the fifth upper work function layer M2E may be located on a level in a direction perpendicular to an upper surface of the substrate (a Z direction) lower than the uppermost end of the fifth lower work function layer M1E. The fifth upper work function layer M2E may have a U-shaped cross-section on a plane (an X-Z plane) perpendicular to an extension direction (a Y direction) of the fifth gate line GLE.

The first to third conductive barrier layers BMA, BMB, and BMC may fill all of the internal spaces of the first to third upper work function layers M2A, M2B, and M2C. The uppermost ends of the first to third conductive barrier layers BMA, BMB, and BMC may be located on a level in a direction perpendicular to an upper surface of the substrate (a Z direction) higher than the uppermost ends of the first to third upper work function layers M2A, M2B, and M2C, respectively. The uppermost end of the first to third conductive barrier layers BMA, BMB, and BMC may be located on approximately the same level as the uppermost end of the fourth lower work function layer M1D.

The lowermost ends of the first and second conductive barrier layers BMA and BMB may be located on a level in a direction perpendicular to an upper surface of the substrate (a Z direction) lower than the lowermost end of the third conductive barrier layer BMC. The lowermost end of the first conductive barrier layer BMA may be located on approximately the same level as, or may be located on a level lower than the lowermost end of the second conductive barrier layer BMB. The lowermost ends of the first and second conductive barrier layers BMA and BMB may be located on a level in a direction perpendicular to an upper surface of the substrate (a Z direction) lower than the uppermost ends of the first to third lower work function layers M1A, M1B, and M1C. In one embodiment, a width WBA of a lower end portion of the first conductive barrier layer BMA in a first direction (an X direction) may have a higher value than a width WBB of a lower end portion of the second conductive barrier layer BMB in the first direction (the X direction).

The lowermost end of the third conductive barrier layer BMC may be located on a level in a direction perpendicular to an upper surface of the substrate (a Z direction) higher than the uppermost end of the first to third lower work function layers M1A, M1B, and M1C.

The fifth conductive buffer layer BME may fill a portion of the U-shaped internal space of the fifth upper work function layer M2E, and the uppermost end of the fifth conductive barrier layer BME may be located on a level in a direction perpendicular to an upper surface of the substrate (a Z direction) higher than the uppermost end of the fifth upper work function layer M2E. The uppermost end of the fifth conductive barrier layer BME may be located on approximately the same level as the uppermost end of the fifth lower work function layer M1E. The fifth conductive barrier layer BME may have a U-shaped cross-section on a plane (an X-Z plane) perpendicular to an extension direction (a Y direction) of the fifth gate line GLE.

The gap fill metal layer GM may fill a U-shaped internal space of the fifth conductive barrier layer BME. An uppermost end of the gap fill metal layer GM and the uppermost end of the fifth conductive barrier layer BME may be located on approximately the same level. In an embodiment, the uppermost end of the gap fill metal layer GM may be formed on a level in a direction perpendicular to an upper surface of the substrate (a Z direction) higher than the uppermost end of the fifth conductive barrier layer BME, due to a difference in etching characteristics of the gap fill metal layer GM and the fifth conductive barrier layer BME.

Heights from the lowermost end to the uppermost end of each of the first to fourth gate lines GLA, GLB, GLC, and GLD may be substantially the same, and may have a fourth height HD. A height from the lowermost end to the uppermost end of the fifth gate line GLE may have a fifth height HE substantially equal to the fourth height HD.

A gate capping layer 134 may be disposed on each of the first to fifth gate lines GLA, GLB, GLC, GLD, and GLE. In the fourth region IV, the gate capping layer 134 may completely fill the U-shaped internal space of the fourth lower work function layer M1D. In the fourth region IV, the gate capping layer 134 may have protrusions extending into the internal space of the fourth lower work function layer M1D.

In each of the first to third regions I, II, and III, the gate capping layer 134 may extend along side surfaces of the corresponding first to third conductive barrier layers BMA, BMB, and BMC, and may have protrusions contacting the uppermost ends of the corresponding first to third upper work function layers M2A, M2B, and M2C.

In the fifth region V, the gate capping layer 134 may extend between the fifth lower work function layer M1E and the fifth conductive barrier layer BME, and may have protrusions contacting the uppermost portion of the fifth upper work function layer M2E.

An operating voltage of the semiconductor device may be determined according to ratios of a lower work function layer having a relatively low work function, constituting a gate line, and an upper work function layer having a relatively high work function.

The semiconductor device 100 according to the present inventive concept may include the fourth transistor TRD having a lower operating voltage than that of the third transistor TRC, by being configured such that the fourth height HD, the height of the fourth lower work function layer M1D in the fourth transistor TRD, has a higher value than the first to third heights HA, HB, and HC, which are the heights of the first to third lower work function layers M1A, M1B, and M1C in the first to third transistors TRA, TRB, and TRC, and the fourth gate line GLD does not include an upper work function layer.

In addition, a mask layer (ML in FIG. 6) may be used to form the fifth gate line GLE of the fifth transistor TRE such that a height of the fourth lower work function layer M1D in the fourth gate line GLD of the fourth transistor TRD is increased. Therefore, the fourth transistor TRD having a lower operating voltage than the third transistor TRC may be easily implemented without adding a separate photolithography process.

FIGS. 3 to 9 are cross-sectional views illustrating methods of manufacturing semiconductor devices according to example embodiments of the present inventive concept. FIGS. 3 to 9 illustrate cross-sectional views regarding positions corresponding to lines A-A', B-B', C-C', D-D', and E-E' in FIG. 1.

Figure 3:
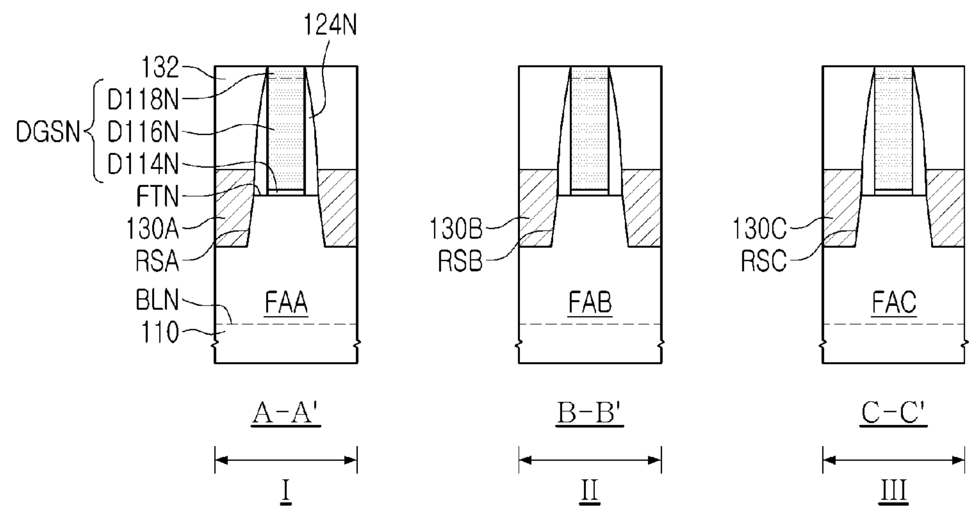
FIGS. 3 to 9 are cross-sectional views illustrating methods of manufacturing semiconductor devices according to example embodiments of the present inventive concept.
Figure 3:
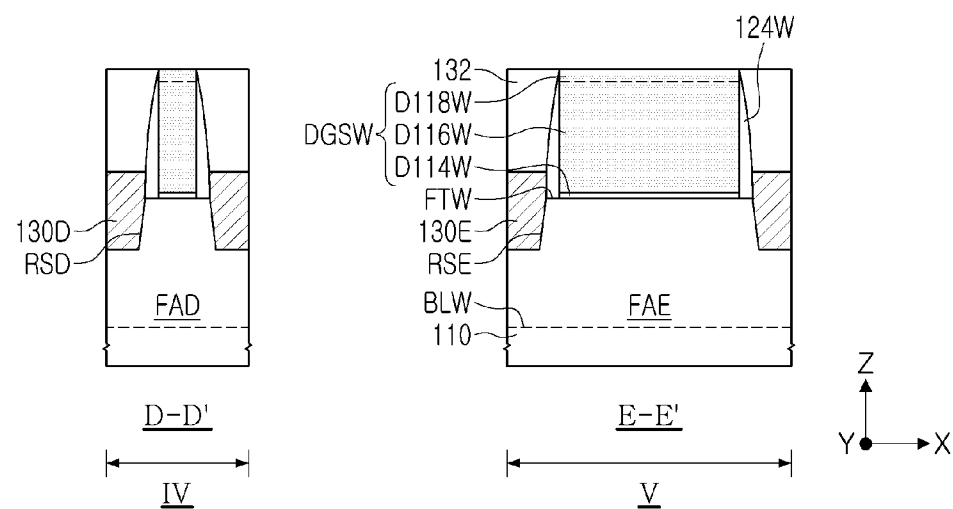

Referring to FIG. 3, a substrate 110 having first to fifth fin-type active regions FAA, FAB, FAC, FAD, and FAE may be provided in each of first to fifth regions I, II, III, IV, and V, respectively. The first region I and the second region II may be, for example, NMOS transistor regions, and the third region III and the fourth region IV may be, for example, PMOS transistor regions. The fifth region V may be, for example, a PMOS transistor region.

The substrate 110 may include a semiconductor such as Si or Ge, or a compound semiconductor such as SiGe, SiC, GaAs, InAs, or InP. The substrate 110 may include a conductive region, for example a well doped with an impurity.

The first fin-type active region FAA may protrude from the substrate 110 in the first region I, the second fin-type active region FAB may protrude from the substrate 110 in the second region II, the third fin-type active region FAC may protrude from the substrate 110 in the third region III, and the fourth fin-type active region FAD may protrude from the substrate 110 in the fourth region IV. A fifth fin-type active region FAE may protrude from the substrate 110 in the fifth region V.

The first to fifth fin-type active regions FAA, FAB, FAC, FAD, and FAE may include p-type or n-type impurity diffusion regions, respectively, depending on a channel type of an MOS transistor to be formed. For example, the first fin-type active region FAA and the second fin-type active region FAB may include a p-type impurity diffusion region, and the third fin-type active region FAC and the fourth fin-type active region FAD may include an n-type impurity diffusion region. For example, the fifth fin-type active region FAE may include an n-type impurity diffusion region.

The first to fourth fin-type active regions FAA, FAB, FAC, and FAD may have a first level BLN, approximately the same level and the lowest level. The fifth fin-type active region FAE may have a second level BLW, the lowest level. The first level BLN and the second level BLW may be approximately the same level, but are not limited thereto. The first to fourth fin-type active regions FAA, FAB, FAC, and FAD may have a first upper surface FTN that is an upper surface of approximately the same level. The fifth fin-type active region FAE may have a second upper surface FTW.

The first upper surface FTN and the second upper surface FTW may be at substantially the same level, but are not limited thereto.

A first dummy gate structure DGSN extending in a direction intersecting the first to fourth fin-type active regions FAA, FAB, FAC, and FAD may be formed on the first to fourth fin-type active regions FAA, FAB, FAC, and FAD in the first to fourth regions I, II, II, and IV. A second dummy gate structure DGSW extending in a direction intersecting the fifth fin-type active region FAE may be formed on the fifth fin-type active region FAE in the fifth region V. A width of the second dummy gate structure DGSW may have a higher value than a width of the first dummy gate structure DGSN, in a direction (an X direction) perpendicular to extension directions (Y directions) of the first and second dummy gate structures DGSN and DGSW. A gate length of the second dummy gate structure DGSW may have a higher value than a gate length of the first dummy gate structure DGSN.

The first dummy gate structure DGSN may include a first dummy gate insulating layer D114N, a first dummy gate line D116N, and a first dummy gate capping layer D118N, which are stacked in sequence on the first to fourth fin-type active regions FAA, FAB, FAC, and FAD. The first dummy gate insulating layer D114N may include silicon oxide. The first dummy gate line D116N may include polysilicon. The first dummy gate capping layer D118N may include at least one of silicon oxide, silicon nitride, and silicon oxynitride.

The second dummy gate structure DGSW may include a second dummy gate insulating layer D114W, a second dummy gate line D116W, and a second dummy gate capping layer D118W, stacked in sequence on the fifth fin-type active region FAE. Each of the second dummy gate insulating layer D114W, the second dummy gate line D116W, and the second dummy gate capping layer D118W may be formed of the same material as each of the first dummy gate insulating layer D114N, the first dummy gate line D116N, and the first dummy gate capping layer D118N.

A first insulation spacer 124N covering both side walls of the first dummy gate structure DGSN may be formed in each of the first to fourth regions I, II, III, and IV, and a second insulation spacer 124W covering both side walls of the second dummy gate structure DGSW may be formed in the fifth region V. The first insulation spacer 124N and the second insulation spacer 124W may be formed of the same material. For example, a material composition of the first insulation spacer 124N may be the same as the material composition of the second insulation spacer 124W. The first insulation spacer 124N and the second insulation spacer 124W may include SiN, SiOCN, SiCN, or combinations thereof.

First to fourth recesses RSA, RSB, RSC, and RSD may be respectively formed in the first to fourth regions I, II, III, and IV by removing a portion of the first to fourth fin-type active regions FAA, FAB, FAC, and FAD on both sides of the first dummy gate structure DGSN and the first insulation spacer 124N. A fifth recess RSE may be formed in the fifth region V by removing a portion of the fifth fin-type active region FAE on both sides of the second dummy gate structure DGSW and the second insulation spacer 124W. In one embodiment, the first to fourth recesses RSA, RSB, RSC, and RSD and the fifth recess RSE may further extend from both sides of the first insulation spacer 124N to a lower side of the first insulation spacer 124N, and may further extend from both sides of the second insulation spacer 124W to a lower side of the second insulation spacer 124W.

First and second source/drain regions 130A and 130B may be formed in the first and second regions I and II, by performing an epitaxial growth process in the first and second fin-type active regions FAA and FAB to be exposed through the first and second recesses RSA and RSB on both sides of the first dummy gate structure DGSN to form a semiconductor layer. Third and fourth source/drain regions 130C and 130D may be formed in the third and fourth regions III and IV, by performing an epitaxial growth process in the third and fourth fin-type active regions FAC and FAD to be exposed through the third and fourth recesses RSC and RSD on both sides of the first dummy gate structure DGSN to form a semiconductor layer. A fifth source/drain region 130E may be formed in the fifth region V, by performing an epitaxial growth process in the fifth fin-type active region FAE to be exposed through the fifth recess RSE on both sides of the second dummy gate structure DGSW to form a semiconductor layer. The first and second source/drain regions 130A and 130B may be Si or SiC semiconductor layers doped with an n-type impurity, and the third and fourth source/drain regions 130C and 130D may be a SiGe semiconductor layer doped with p-type impurity. For example, the fifth source/drain region 130E may be a SiGe semiconductor layer doped with a p-type impurity.

An interlayer insulating film 132 covering the first to fifth source/drain regions 130A, 130B, 130C, 130D and 130E, the first and second dummy gate structures DGSN and DGSW, and the first and second gate insulation spacers 124N and 124W may be formed in the first to fifth regions I, II, III, IV, and V. An upper surface of the interlayer insulating film 132 may be located on the same level as the upper surfaces of the first and second dummy gate capping layers D118N and D118W. The upper surface of the interlayer insulating film 132 may be coplanar with the upper surfaces of the first and second dummy gate capping layers D118N and D118W.

Figure 4:
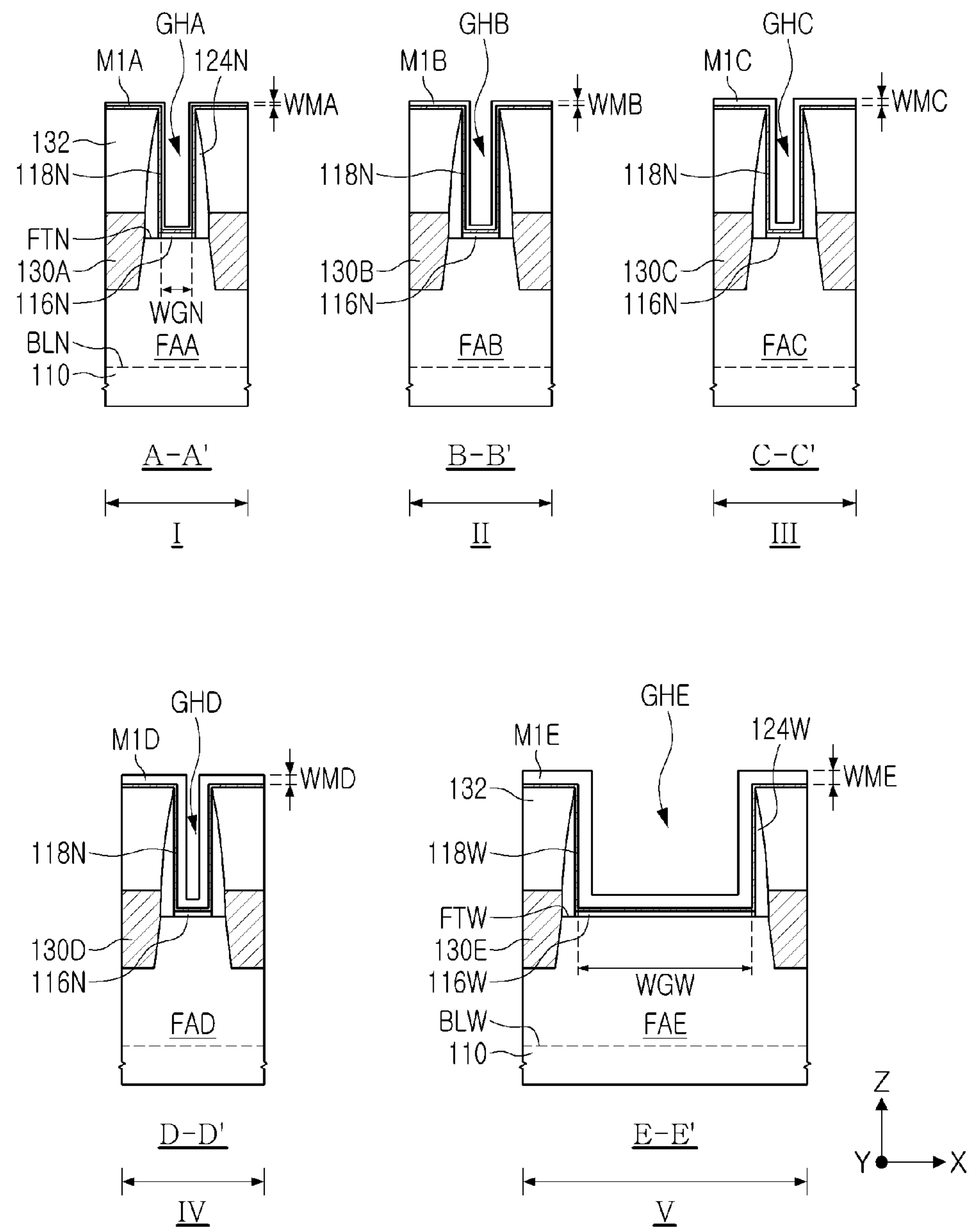

Referring to FIG. 4, first and second dummy gate structures DGSN and DGSW exposed through interlayer insulating films 132 in first to fifth regions I, II, III, IV, and V may be removed to form first to fifth gate spaces GHA, GHB, GHC, GHD and GHE in the first to fifth regions I, II, III, IV, and V, respectively. First and second insulation spacers 124N and 124W and first to fifth fin-type active regions FAA, FAB, FAC, FAD, and FAE may be exposed through the first to fifth gate spaces GHA, GHB, GHC, GHD, and GHE.

A first interface film 116N and a first gate insulating layer 118N may be formed in the first to fourth gate spaces GHA, GHB, GHC, and GHD in the first to fourth regions I, II, III, and IV. A second interface film 116W and a second gate insulating layer 118W may be formed in the fifth gate space GHE in the fifth region V.

The first and second interface films 116N and 116W may be formed by oxidizing a portion of the first to fifth fin-type active regions FAA, FAB, FAC, FAD, and FAE to be exposed in the first to fifth gate spaces GHA, GHB, GHC, GHD, and GHE, for example. The first and second interface films 116N and 116W may be formed on the first to fifth fin-type active regions FAA, FAB, FAC, FAD, and FAE to be exposed on a lower surface of the first to fifth gate spaces GHA, GHB, GHC, GHD, and GHE. The first and second interface films 116N and 116W may be formed of, for example, a silicon oxide film, a silicon oxynitride film, or a combination thereof.

The first and second gate insulating layers 118N and 118W may be formed to cover the first interface film 116N, inner surfaces of the first to fifth gate spaces GHA, GHB, GHC, GHD, and GHE, and an upper surface of the interlayer insulating film 132. The first and second gate insulating layers 118N and 118W may be formed by, for example, an atomic layer deposition (ALD), chemical vapor deposition (CVD), or physical vapor deposition (PVD) process. A space defined by the first gate insulating layer 118N in each of the first to fourth gate spaces GHA, GHB, GHC, and GHD may have a first width WGN of the same value. A space defined by the second gate insulating layer 118W in the fifth gate space GHE may have a second width WGW having a wider value than the first width WGN.

First to fourth lower work function layers M1A, M1B, M1C, and M1D may be formed on the first gate insulating layer 118N in each of the first to fourth regions I, II, III, and IV, respectively. Fifth lower work function layer M1E may be formed on the second gate insulating layer 118W in the fifth region V.

The first to fourth lower work function layers M1A, M1B, M1C, and M1D may be conformally formed on the first gate insulating layer 118N not to completely fill the inside of the first to fourth gate spaces GHA, GHB, GHC, and GHD. The fifth lower work function layer M1E may be conformally formed on the second gate insulating layer 118W to not completely fill the inside of the fifth gate space GHE. The first to fifth lower work function layers M1A, M1B, M1C, M1D, and M1E may have first to fifth thicknesses WMA, WMB, WMC, WMD, and WME, respectively. The first thickness WMA may have a lower value than the second thickness WMB. The second thickness WMB may have a lower value than the third thickness WMC. The third thickness WMC may have a lower value than the fourth thickness WMD. The fifth thickness WME may have a higher value than the fourth thickness WMD, but is not limited thereto. In one embodiment, the fifth thickness WME may have the same value as, or may have a lower value than the fourth thickness WMD.

The first to fifth lower work function layers M1A, M1B, M1C, M1D, and M1E may be formed of, for example, TiN, TaN, W, WCN, or a combination thereof. The first to fifth lower work function layers M1A, M1B, M1C, M1D, and M1E may be formed by, for example, ALD, CVD, or PVD processes.

A dielectric film barrier layer (not shown) may be formed between the first and second gate insulating layers 118N and 118W and the first to fifth lower work function layers M1A, M1B, M1C, M1D, and M1E. The dielectric film barrier layer may be formed of, for example, at least one of a metal selected from Ti, Ta, W, Ru, Nb, Mo, and Hf, a metal nitride, a metal carbide, a metal silicon nitride, or a combination thereof.

Figure 5:
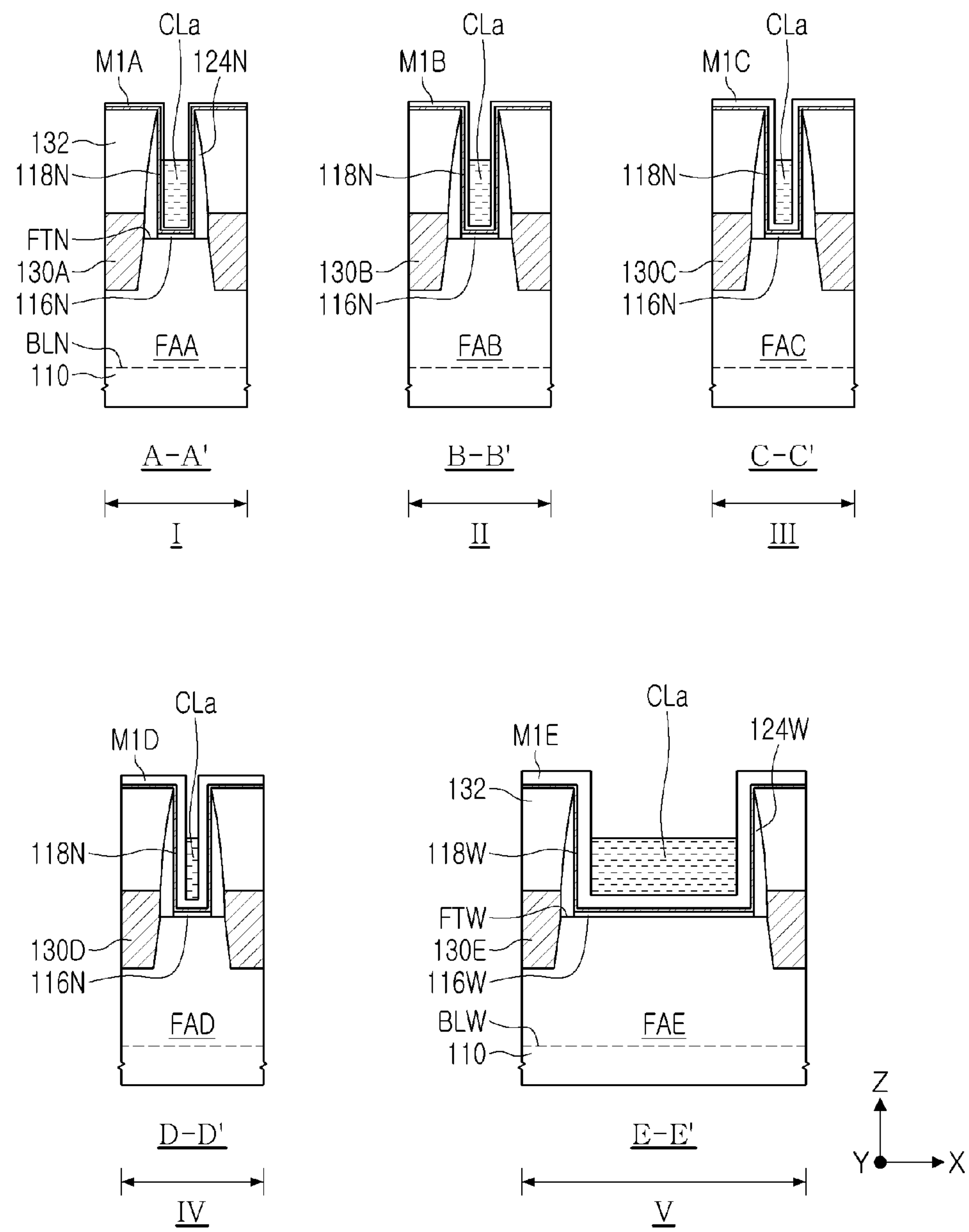

Referring to FIG. 5, a coating layer may be formed to cover each of the first to fifth lower work function layers M1A, M1B, M1C, M1D, and M1E in first to fifth regions I, II, III, IV, and V, respectively, and to completely fill first to fifth gate spaces GHA, GHB, GHC, GHD, and GHE (see FIG. 4). The coating layer may be formed of, for example, a carbon-based film. The carbon-based film may be formed of, for example, a film of an amorphous carbon layer (ACL) or a carbon-based spin-on hardmask (C—SOH).

A portion of the coating layer may be removed in each of the first to fifth regions I, II, III, IV, and V to form a cover layer CLa covering a lower side portion of the first to fifth gate spaces GHA, GHB, GHC, GHD, and GHE (see FIG. 4) in the first to fifth lower work function layers M1A, M1B, M1C, M1D, and M1E.

Figure 6:
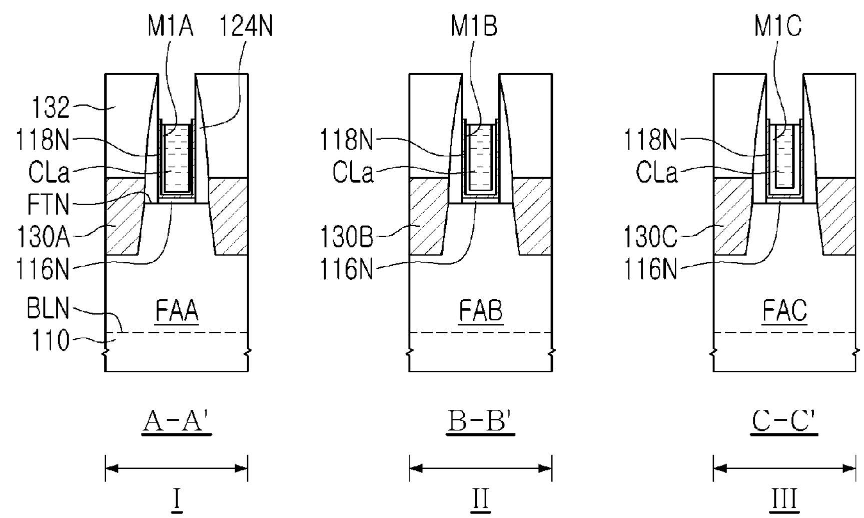
Figure 6:
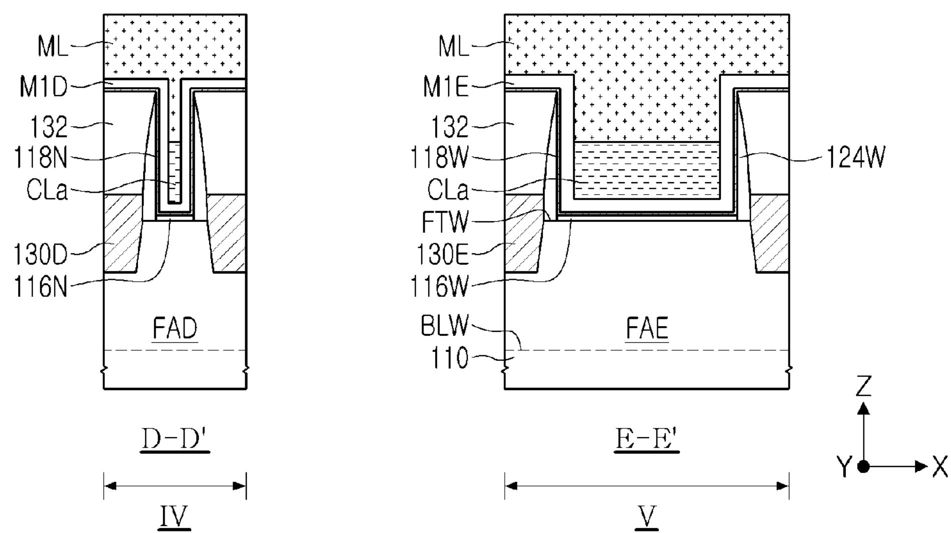

Referring to FIG. 6, a cover layer CLa, and a mask layer ML completely covering fourth and fifth lower work function layers M1D and M1E may be formed in a fourth region IV and a fifth region V, respectively. The mask layer ML may be formed of, for example, a photoresist. The mask layer ML may be not formed in first to third regions I, II, and III.

In the first to third regions I, II, and III, a portion of a first gate insulating layer 118N and a portion of first to third lower work function layers M1A, M1B, and M1C may be removed. A lower side portion covered by the cover layer CLa among the first to third lower work function layers M1A, M1B, and M1C may be left without being removed. An uppermost end of the first gate insulating layer 118N in each of the first to third regions I, II, and III may have a level in a direction perpendicular to an upper surface of the substrate (a Z direction) higher than an uppermost end of remaining portions of the first to third lower work function layers M1A, M1B, and M1C.

The fourth and fifth lower work function layers M1D and M1E covered with the mask layer ML in a fourth region IV and a fifth region V, and the first and second gate insulating layers 118N and 118W may be left without being removed.

Figure 7:
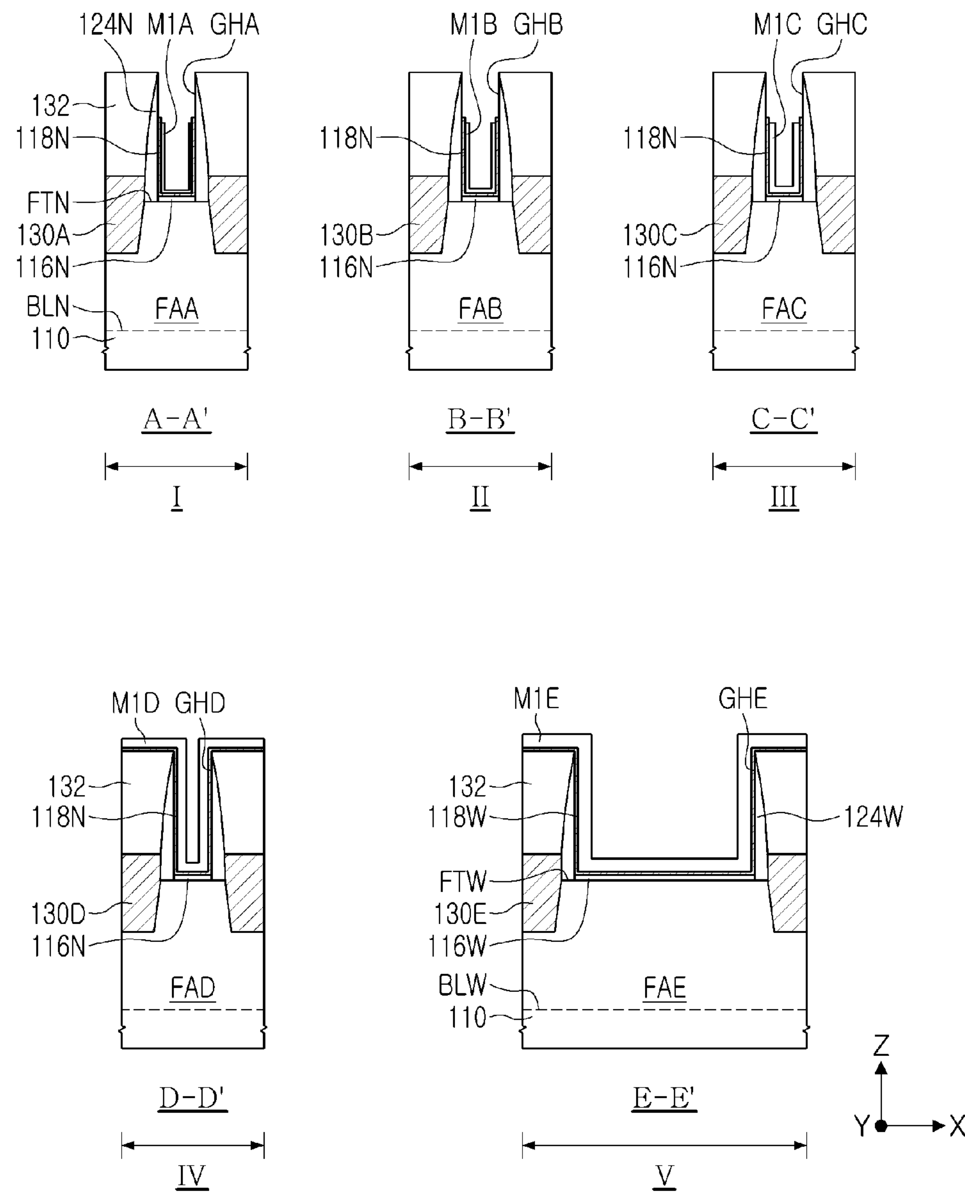

Referring to FIG. 7, a mask layer (ML in FIG. 6) and a cover layer (CLa in FIG. 6) may be removed. The mask layer ML and the cover layer CLa may be removed together, for example, by an ashing process and a strip process.

Figure 8:
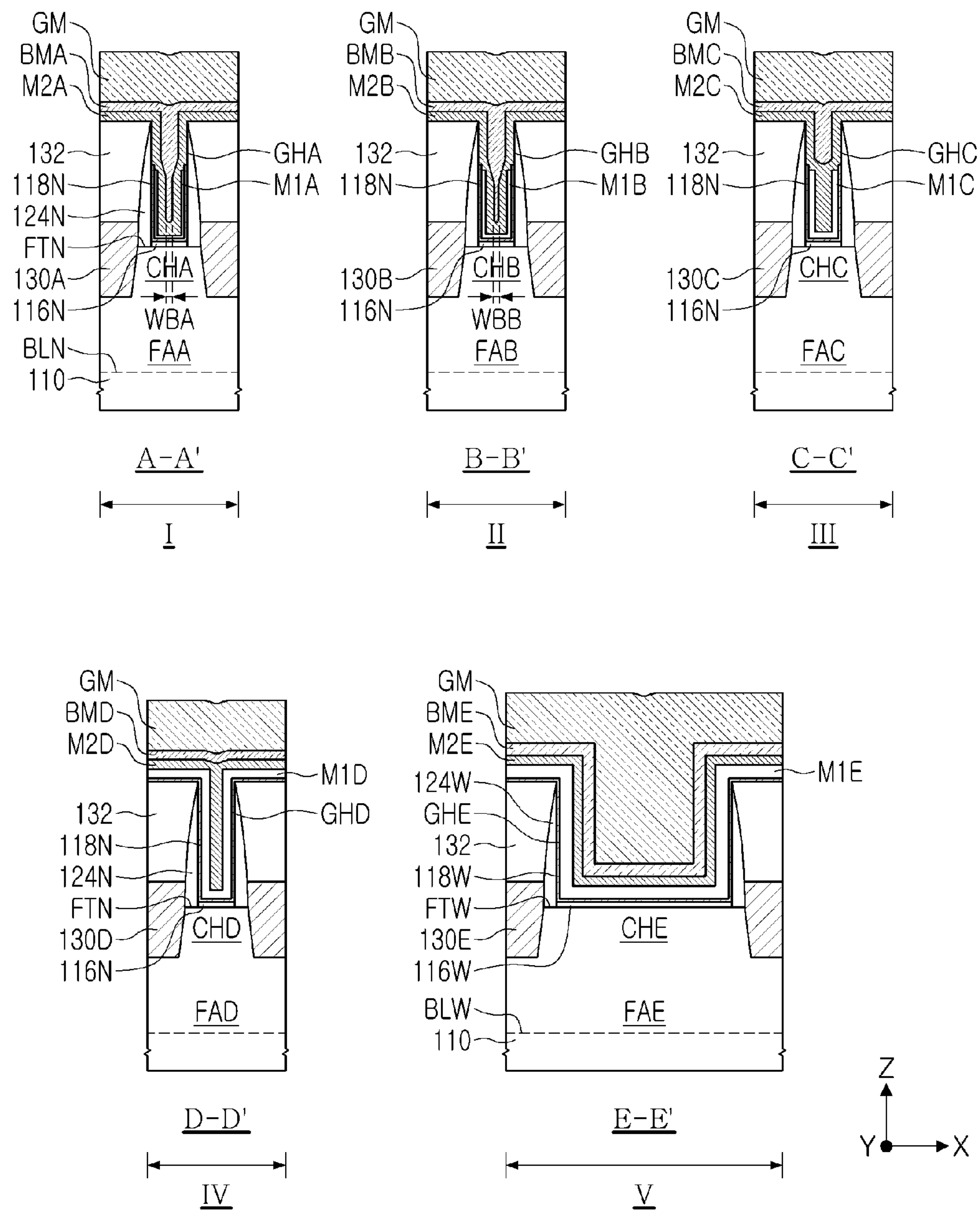

Referring to FIG. 8, first to fifth upper work function layers M2A, M2B, M2C, M2D, and M2E, and first to fifth conductive barrier layers BMA, BMB, BMC, BMD, and BME may be formed in sequence on first to fifth lower work function layers M1A, M1B, M1C, M1D, and M1E in each of first to fifth regions I, II, III, IV, and V.

The first to fifth upper work function layers M2A, M2B, M2C, M2D, and M2E may be formed of materials, different from materials used in the first to fifth lower work function layers M1A, M1B, M1C, M1D, and M1E. For example, a material composition of each of the first to fifth upper work function layers M2A, M2B, M2C, M2D, and M2E may be different from a material composition of corresponding one of the first to fifth lower work function layers M1A, M1B, M1C, M1D, and M1E.

Each of the first to fifth upper work function layers M2A, M2B, M2C, M2D, and M2E may be formed of the same material composition. The first to fifth upper work function layers M2A, M2B, M2C, M2D, and M2E may be formed of TiAl, TiAlC, TiAlN, or a combination thereof. The first to fifth upper work function layers M2A, M2B, M2C, M2D, and M2E may be formed together, for example, by an ALD, CVD, or PVD process. The first to fifth upper work function layers M2A, M2B, M2C, M2D, and M2E may be formed, respectively, to have the same thickness in the first to fifth regions I, II, III, IV, and V.

In the fourth region IV, the fourth upper work function layer M2D may completely fill the space defined between the fourth lower work function layer M1D in a fourth gate space GHD. The first to third upper work function layers M2A, M2B, and M2C may fill a portion of the first to third gate spaces GHA, GHB, and GHC in the first to third regions I, II, and III. In the fifth region V, the fifth upper work function layer M2E may fill a portion of the fifth gate space GHE.

The first to fifth conductive barrier layers BMA, BMB, BMC, BMD, and BME may be formed of the same material composition. The first to fifth conductive barrier layers BMA, BMB, BMC, BMD, and BME may be formed of a metal nitride, for example, TiN, TaN, or a combination thereof. The first to fifth conductive barrier layers BMA, BMB, BMC, BMD, and BME may be formed together by, for example, an ALD, CVD, or PVD process. The first to fifth conductive barrier layers BMA, BMB, BMC, BMD, and BME may be formed to have the same thickness in the first to fifth regions I, II, III, IV, and V, respectively.

The first to third conductive barrier layers BMA, BMB, and BMC may fill the remaining first to third gate spaces GHA, GHB, and GHC in the first to third regions I, II, and III. In the fifth region V, the fifth conductive barrier layer BME may fill only a portion of the fifth gate space GHE. The first to third conductive barrier layers BMA, BMB, and BMC may extend into the first to third gate spaces GHA, GHB, and GHC. A lowermost end of the third conductive barrier layer BMC may be located on a level higher than lowermost ends of the first and second conductive barrier layers BMA and BMB. The first and second conductive barrier layers BMA and BMB may extend into a space defined between the first and second lower work function layers MIA and M1B. The first and second conductive barrier layers BMA and BMB may have lower sides having a width narrower than upper sides in the first and second gate spaces GHA and GHB.

A gap fill metal layer GM may be formed on the first to fifth conductive barrier layers BMA, BMB, BMC, BMD, and BME in the first to fifth regions I, II, III, IV, and V. The gap fill metal layer GM may be made of, for example, tungsten W. In the fifth region V, the gap fill metal layer GM may completely fill the remaining fifth gate space GHE.

Figure 9:
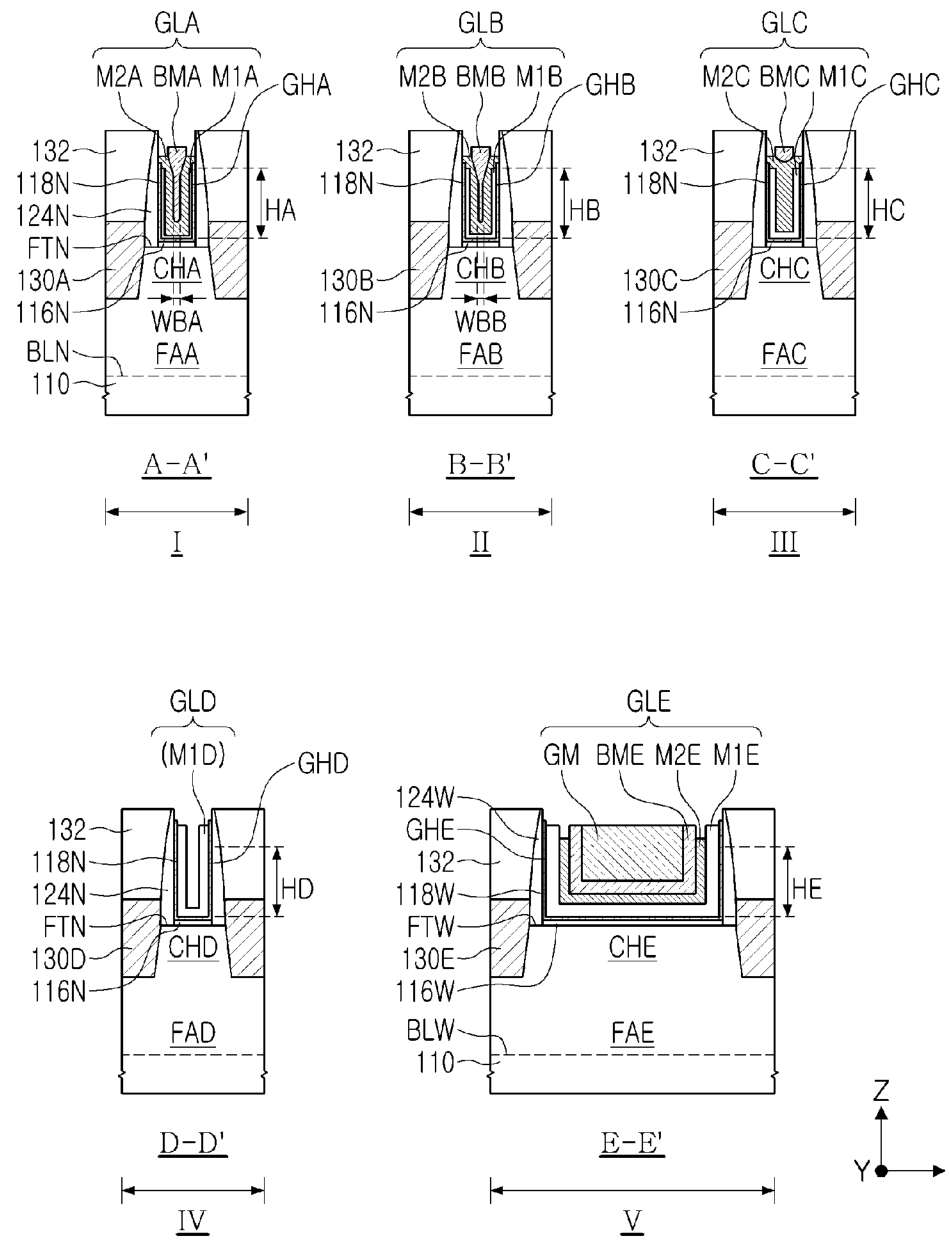

Referring to FIG. 9, first to fifth gate lines GLA, GLB, GLC, GLD, and GLE may be formed. A gap fill metal layer GM formed on an interlayer insulating film 132, first to fifth conductive barrier layers BMA, BMB, BMC, BMD, and BME, and first to fifth upper work function layers M2A, M2B, M2C, M2D, and M2E may be all removed by a planarization process, such as a chemical-mechanical polishing/planarization (CMP) in the first to fifth regions I, II, III, IV, and V. In the first to third regions I, II, and III, a gap fill metal layer GM may be all removed. In the fourth region IV, the fourth conductive barrier layer BMD may be all removed.

In addition, a portion of the gap fill metal layer GM formed in upper side portions of first to fifth gate spaces GHA, GHB, GHC, GHD, and GHE, a portion of the first to fifth conductive barrier layers BMA, BMB, BMC, BMD, and BME, and a portion of the first to fifth upper work function layers M2A, M2B, M2C, M2D, and M2E may be further removed. As a result, upper side portions of first and second insulation spacers 124N and 124W in the first to fifth regions I, II, III, IV, and V may be exposed.

Then, the fourth upper work function layer M2D may be completely removed in the fourth region IV by an etching process, e.g., a wet etching process. By the wet etching process, a portion of the first to third upper work function layers M2A, M2B, and M2C may be removed in the first to third regions I, II, and III, and a portion of the fifth upper work function layer M2E may be removed in the fifth region V. Therefore, uppermost ends of the first to third upper work function layers M2A, M2B, and M2C may be located on a level in a direction perpendicular to an upper surface of the substrate (a Z direction) lower than uppermost ends of first to third lower work function layers M1A, M1B, and M1C. An uppermost end of the fifth upper work function layer M2E may be located on a level in a direction perpendicular to an upper surface of the substrate (a Z direction) lower than an uppermost end of a fifth lower work function layer M1E. The wet process may be performed using HF or $H_2SO_4$.

Referring again to FIG. 2, a gate capping layer 134 may be formed on each of the first to fifth gate lines GLA, GLB, GLC, GLD, and GLE.

In the fourth region IV, the gate capping layer 134 may fill a space from which the fourth upper work function layer M2D is removed.

Figure 10:
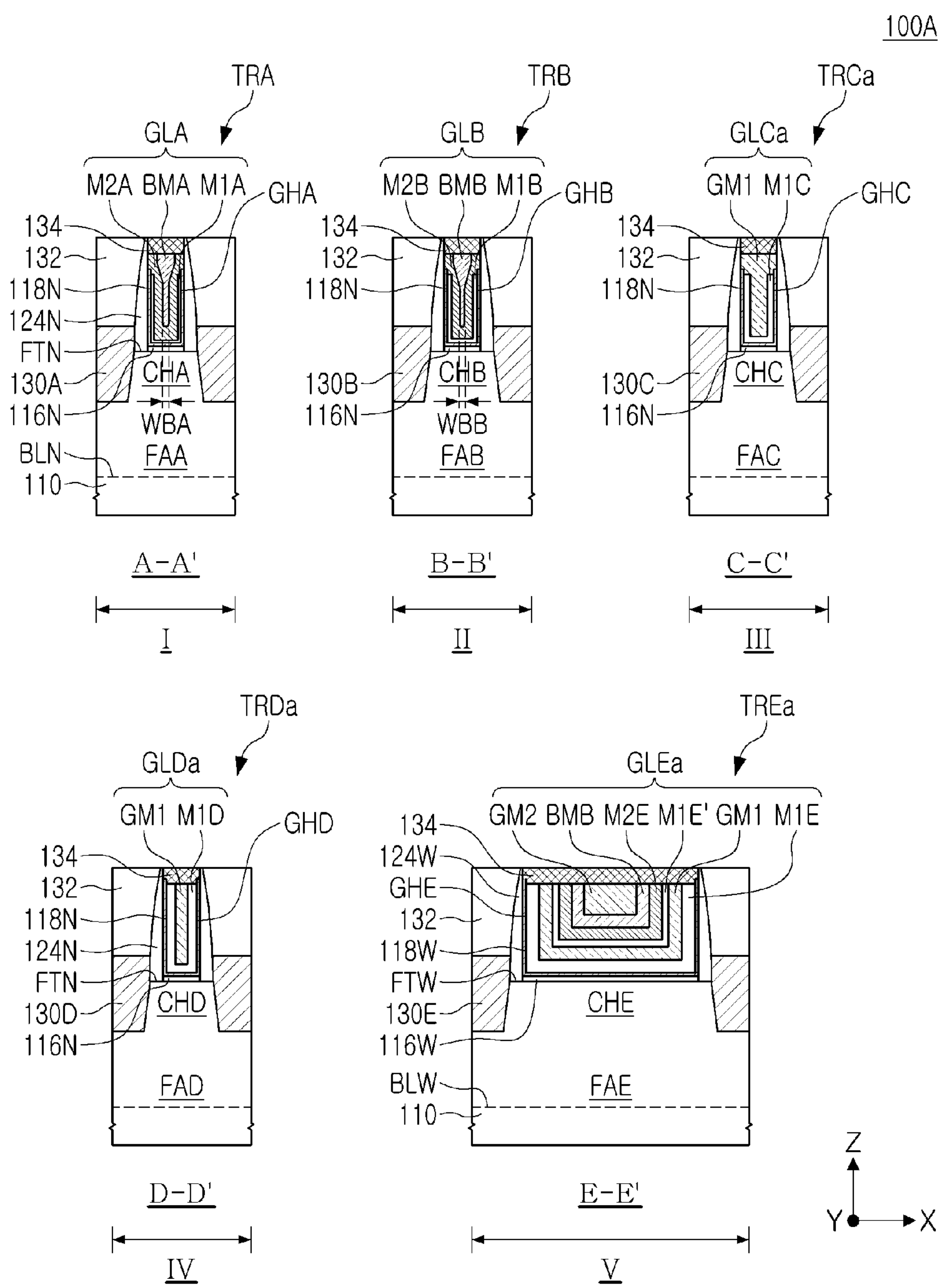
FIG. 10 is a cross-sectional view illustrating a semiconductor device according to an example embodiment of the present inventive concept.

FIG. 10 is a cross-sectional view illustrating a semiconductor device according to an example embodiment of the present inventive concept. FIG. 10 illustrates a cross-sectional view of a position corresponding to lines A-A', B-B', C-C', D-D', and E-E' in FIG. 1. In a description of a semiconductor device 100A of FIG. 10, the same parts as those of the semiconductor device 100 of FIG. 2 may be omitted.

The semiconductor device 100A may include first to fifth regions I, II, III, IV, and V. A first transistor TRA, a second transistor TRB, a third transistor TRCa, a fourth transistor TRDa, and a fifth transistor TREa may be arranged in the first region I, the second region II, the third region III, the fourth region IV, and the fifth region V, respectively.

The semiconductor device 100A may include first to fifth fin-type active regions FAA, FAB, FAC, FAD, and FAE, protruding from a substrate 110, in the first to fifth regions I, II, III, IV, and V of the substrate 110.

A first gate insulating layer 118N may be present on a first interface film 116N, and first to fourth gate lines GLA, GLB, GLCa, and GLDa may cover first to fourth channel regions CHA, CHB, CHC, and CHD and may extend in directions intersecting first to fourth fin-type active regions FAA, FAB, FAC, and FAD, respectively, in the first to fourth regions I, II, III, and IV. A second gate insulating layer 118W may be present on a second interface film 116W, and a fifth gate line GLEa may cover a fifth channel region CHE and may extend in a direction intersecting a fifth fin-type active region FAE, in the fifth region V.

The first gate line GLA may include a first lower work function layer M1A, a first upper work function layer M2A, and a first conductive barrier layer BMA. The second gate line GLB may include a second lower work function layer M1B, a second upper work function layer M2B, and a second conductive barrier layer BMB. The third gate line GLCa may include a third lower work function layer M1C and a first gap fill metal layer GM1. The fourth gate line GLDa may include a fourth lower work function layer M1D and a first gap fill metal layer GM1. The fifth gate line GLEa may include a fifth lower work function layer M1E, a first gap fill metal layer GM1, a fifth intermediate work function layer M1E', a fifth upper work function layer M2E, a fifth conductive barrier layer BME, and a second gap fill metal layer GM2. In one embodiment, the fifth gate line GLEa may not include the fifth intermediate work function layer M1E'.

The first to fifth lower work function layers M1A, M1B, M1C, M1D, and M1E may be formed of, for example, TiN, TaN, W, WCN, or a combination thereof.

Heights from a lowermost end to an uppermost end of each of the first to fifth lower work function layers M1A, M1B, M1C, M1D, and M1E may be first to fifth heights HA, HB, HC, HD, and HE, respectively. The first to third heights HA, HB, and HC may have approximately the same value. The fourth and fifth heights HD and HE may have approximately the same value. The fourth and fifth heights HD and HE may have values higher than the first to third heights HA, HB, and HC.

The first to fifth lower work function layers M1A, M1B, M1C, M1D, and M1E may have a U-shaped cross-section on a plane (an X-Y plane) perpendicular to an extension direction (a Y direction) of the first to fifth gate lines GLA, GLB, GLC, GLD, and GLE.

The first and second upper work function layers M2A and M2B may cover the first and second lower work function layers M1A and M1B, respectively.

The first gap fill metal layer GM1 may cover the third to fifth lower work function layers M1C, M1D, and M1E.

The first gap fill metal layer GM1 of the fifth gate line GLEa may conformally cover the fifth lower work function layer M1E, the fifth intermediate work function layer M1E' may conformally cover the first gap fill metal layer GM1, and the fifth upper work function layer M2E may conformally cover the fifth intermediate work function layer M1E'.

The fifth intermediate work function layer M1E' may be made of, for example, TiN, TaN, W, WCN, or a combination thereof. The first, second and fifth upper work function layers M2A, M2B, and M2E may be formed of, for example, an alloy containing aluminum Al, a conductive metal carbide containing Al, a conductive metal nitride containing Al, or a combination thereof. In one embodiment, the first, second and fifth upper work function layers M2A, M2B, and M2E may include TiAl, TiAlC, TiAlN, or a combination thereof.

In the first and second regions I and II, the uppermost ends of the first and second conductive barrier layers BMA and BMB may be located on approximately the same level as the uppermost ends of the first and second upper work function layers M2A and M2B. The uppermost ends of the first and second conductive barrier layers BMA and BMB may be located on approximately the same level as the uppermost end of the fourth lower work function layer M1D and the uppermost end of the first gap fill metal layer GM1.

In the third region III, the first gap fill metal layer GM1 may completely fill a U-shaped internal space of the third lower work function layer M1C, and the uppermost portion of the first gap fill metal layer GM1 may be located on a level in a direction perpendicular to an upper surface of the substrate (a Z direction) higher than the uppermost level of the third lower work function layer M1C.

In the fourth region IV, the first gap fill metal layer GM1 may completely fill a U-shaped internal space of the fourth lower work function layer M1D, and the uppermost portion of the first gap fill metal layer GM1 may be located on approximately the same level as the uppermost end of the fourth lower work function layer M1D.

In the fifth region V, the first gap fill metal layer GM1 may fill a portion of a U-shaped internal space of the fifth lower work function layer M1E, and the fifth intermediate work function layer M1E', the upper work function layer M2E, and the fifth conductive barrier layer BME may be stacked in sequence in an internal space of a U-shape of the first gap fill metal layer GM1. The second gap fill metal layer GM2 may completely fill a U-shaped internal space of the fifth conductive barrier layer BME. The uppermost end of the fifth upper work function layer M2E may be located on a level in a direction perpendicular to an upper surface of the substrate (a Z direction) lower than the uppermost end of the fifth lower work function layer M1E.

A gate capping layer 134 may be disposed on each of the first to fifth gate lines GLA, GLB, GLCa, GLDa, and GLEa.

An operating voltage of the semiconductor device may be determined according to ratios of a lower work function layer having a relatively low work function, constituting a gate line, and an upper work function layer having a relatively high work function.

The semiconductor device 100A according to the present inventive concept may include the fourth transistor TRD having a lower operating voltage than that of the third transistor TRC, by being configured such that the fourth height HD, the height of the fourth lower work function layer M1D in the fourth transistor TRD, has a higher value than the first to third heights HA, HB, and HC, which are the heights of the first to third lower work function layers M1A, M1B, and M1C in the first to third transistors TRA, TRB, and TRC, and the fourth gate line GLD does not include an upper work function layer. In cases of the third and fourth transistors TRC and TRD, since they are filled with a gap fill metal layer formed of tungsten instead of an upper work function layer, they may have a low gate resistance.

FIGS. 11 to 16 are cross-sectional views illustrating methods of manufacturing semiconductor devices according to example embodiments of the present inventive concept. FIGS. 11 to 16 illustrate cross-sectional views regarding positions corresponding to lines A-A', B-B', C-C', D-D', and E-E' in FIG. 1.

After the process described with reference to FIG. 3 is completed, the processes of FIGS. 11 to 16 may proceed.

Figure 11:
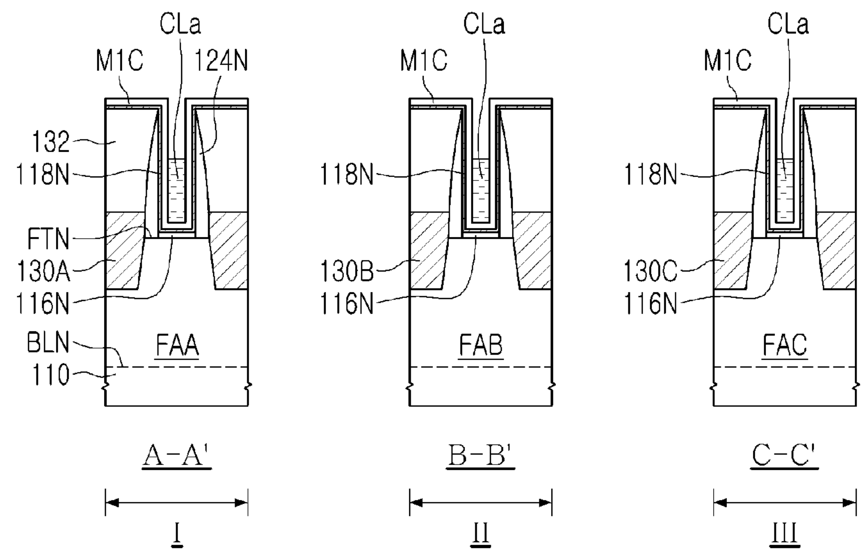
FIGS. 11 to 16 are cross-sectional views illustrating methods of manufacturing semiconductor devices according to example embodiments of the present inventive concept.
Figure 11:
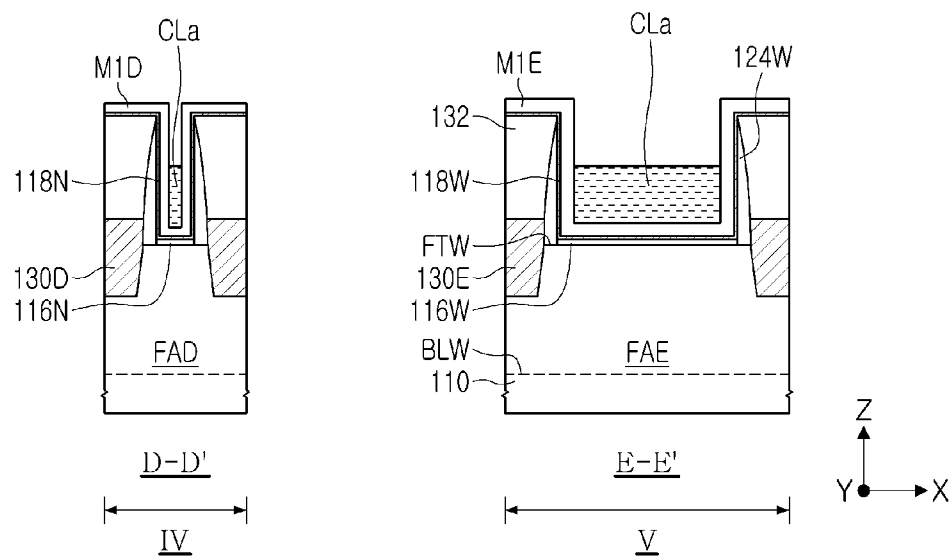

A process of FIG. 11 may be different from the processes described with reference to FIGS. 4 and 5, in view of the fact that a third lower work function layer M1C may be formed on a first gate insulating layer 118N in all first to third regions I, II, and III, and the rest may be the same.

Figure 12:
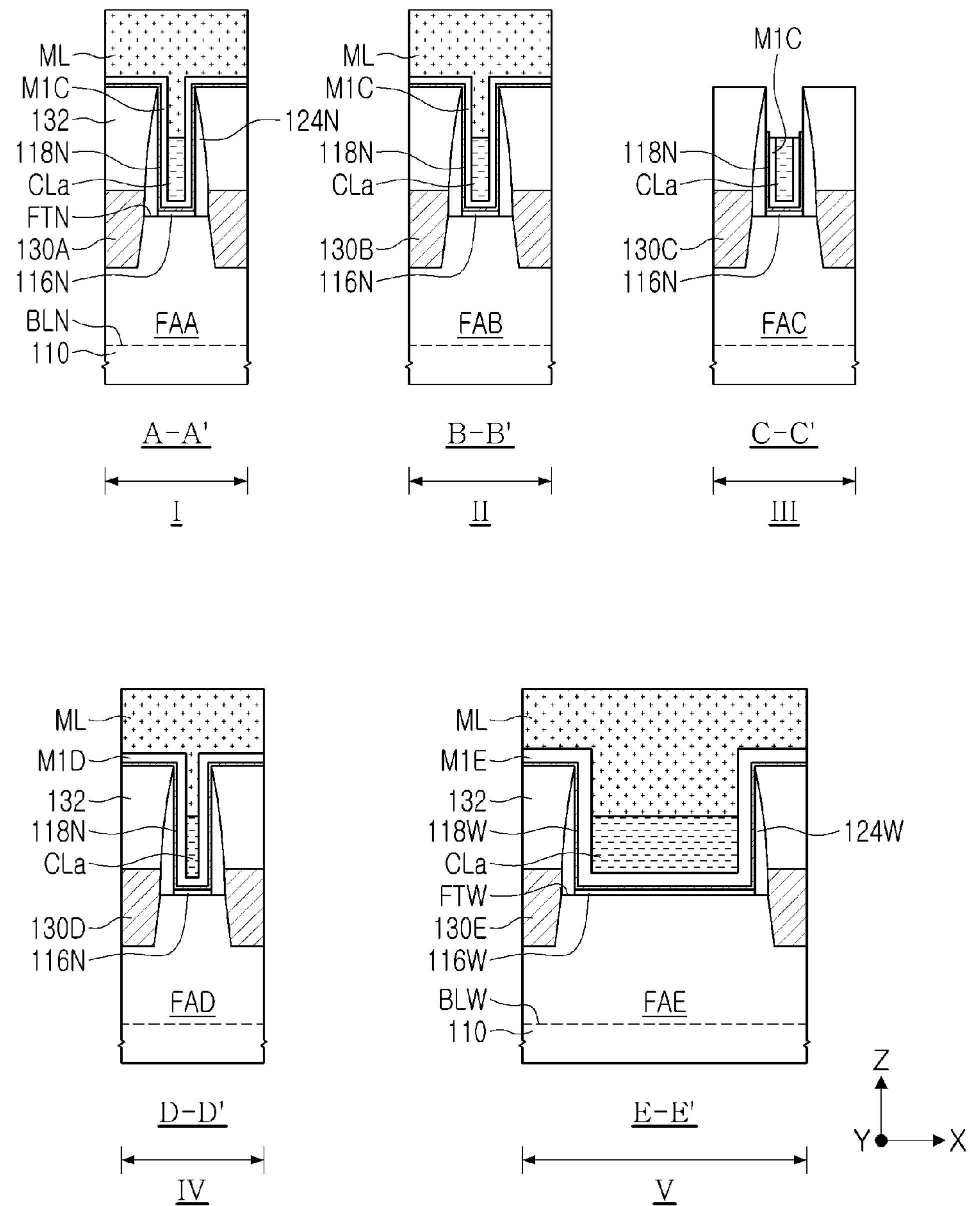

Referring to FIG. 12, a cover layer CLa, and a mask layer ML covering third to fifth lower work function layers M1C, M1D, and M1E may be formed in a first region I, a second region II, a fourth region IV, and a fifth region V, respectively. The mask layer ML may be formed of, for example, a photoresist. The mask layer ML may be not formed in a third region III.

In the third region III, a portion of the first gate insulating layer 118N and a portion of the third lower work function layer M1C are removed. The lower portion covered by the cover layer CLa in the third lower work function layer M1C may remain without being removed.

Figure 13:
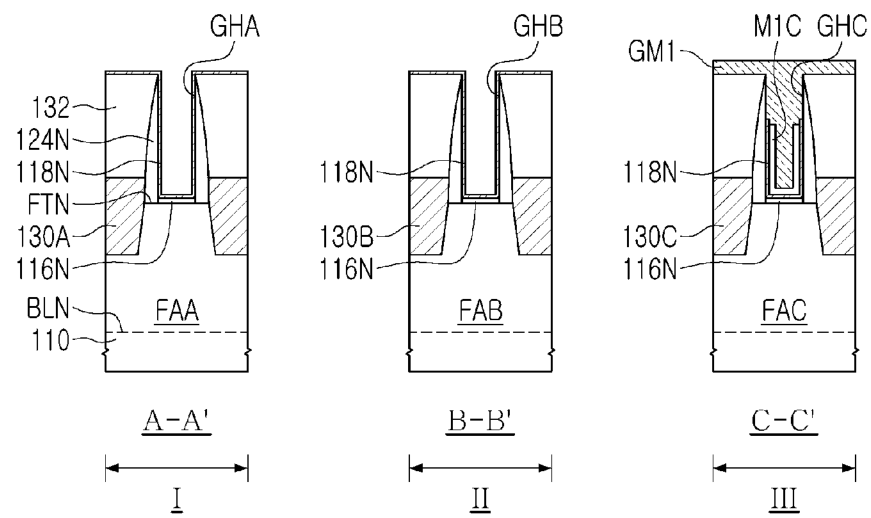
Figure 13:
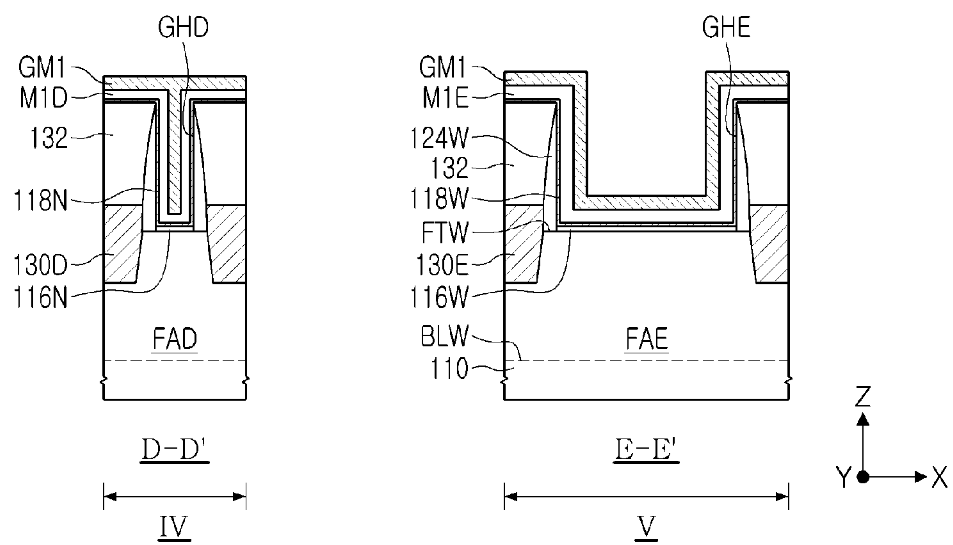

Referring to FIG. 13, a mask layer (ML in FIG. 12) and a cover layer (CLa in FIG. 12) may be removed. The mask layer ML and the cover layer CLa may be removed together, for example, by an ashing process and a strip process.

A first gap fill metal layer GM1 may be formed on each of third to fifth lower work function layers M1C, M1D, and M1E in each of first to fifth regions I, II, III, IV, and V. The first gap fill metal layer GM1 may be formed to completely fill the inside of first to fifth gate spaces GHA, GHB, GHC, GHD, and GHE, may be formed to fill partially the inside of fifth gate space GHE, and may be formed conformally on a fifth lower work function layer M1E. The first gap fill metal layer GM1 may be formed of, for example, tungsten W.

The first gap fill metal layer GM1 and the third lower work function layer M1C may be completely removed in the first and second regions I and II by a photolithography process and an etching process. The etching process may include a wet etching process using a solution containing $H_2O_2$. The solution may include dilute sulfuric peroxide DSP. The etching process may include a dry etching process using an etching gas such as $NF_3$, $NH_3$, or the like. The etching process may be a process in which a wet etching process and a dry etching process are mixed.

Figure 14:
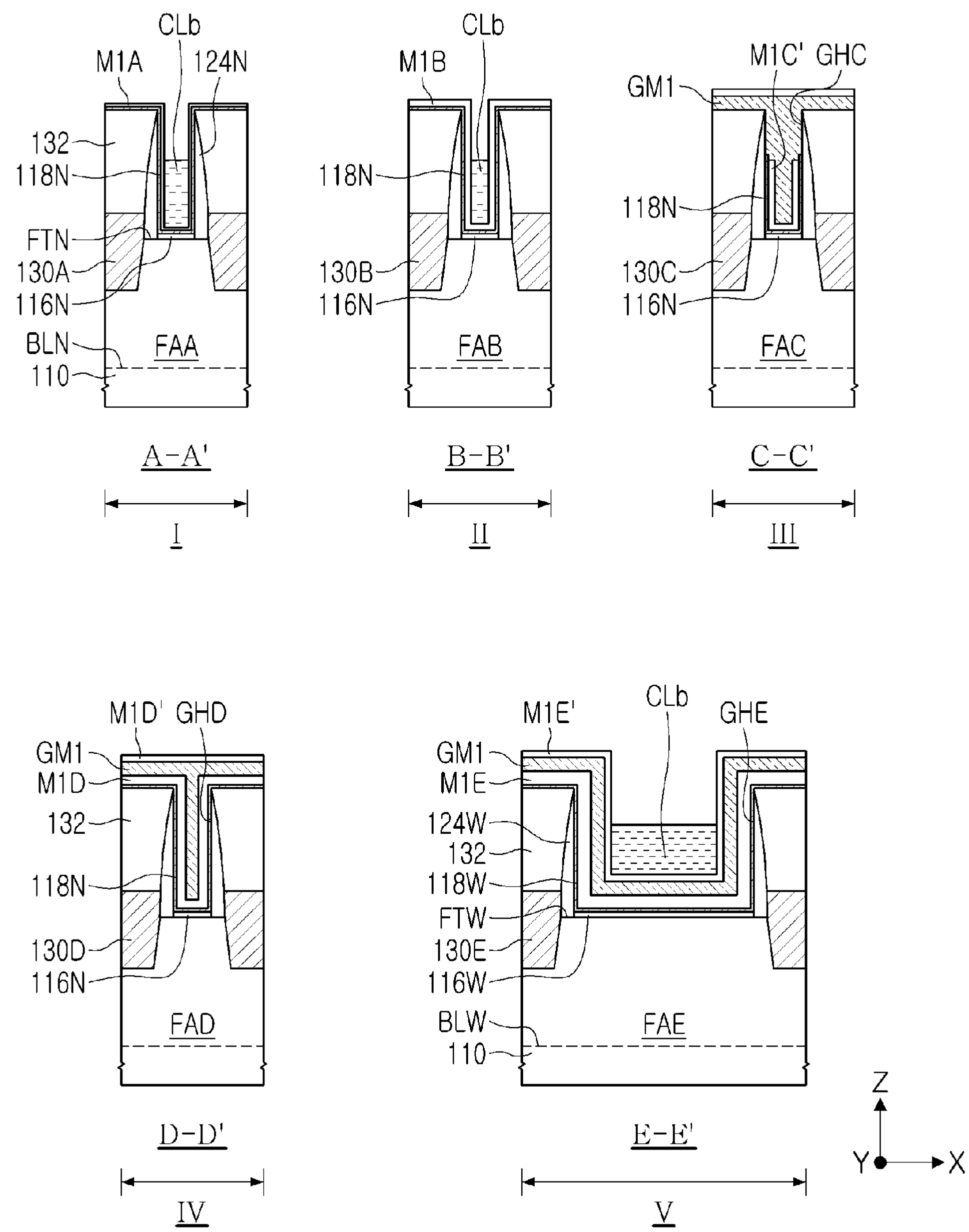

Referring to FIG. 14, first and second lower work function layers M1A and M1B may be formed in first and second regions I and II, respectively. Third to fifth intermediate work function layers M1C', M1D', and M1E' may be formed in third to fifth regions III, IV, and V, respectively. In one embodiment, the third to fifth intermediate work function layers M1C', and M1E' formed in each of the third to fifth regions III, IV, and V may be removed.

Each of the first and second lower work function layers M1A and M1B may be formed conformally on the first gate insulating layers 118N.

A cover layer CLb may be formed to cover a lower side portion of the first and second lower work function layers M1A and M1B in the first and second regions I and II, and to cover a lower side portion of the fifth intermediate work function layer M1E' in the fifth region V.

Figure 15:
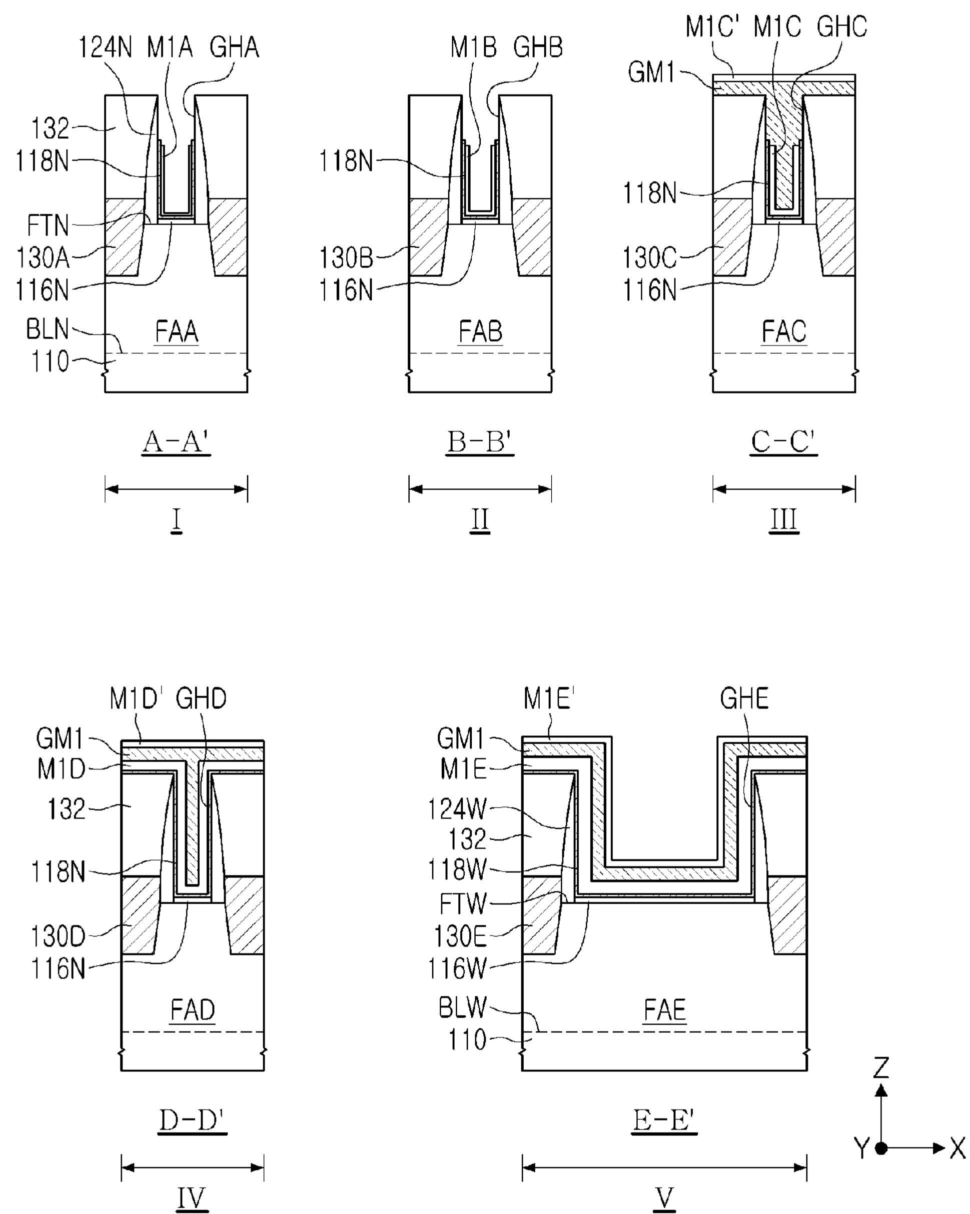

Referring to FIG. 15, in the first and second regions I and II, a portion of the first gate insulating layer 118N not covered by the cover layer CLb, and portions of the first and second lower work function layers M1A and M1B may be removed.

Figure 16:
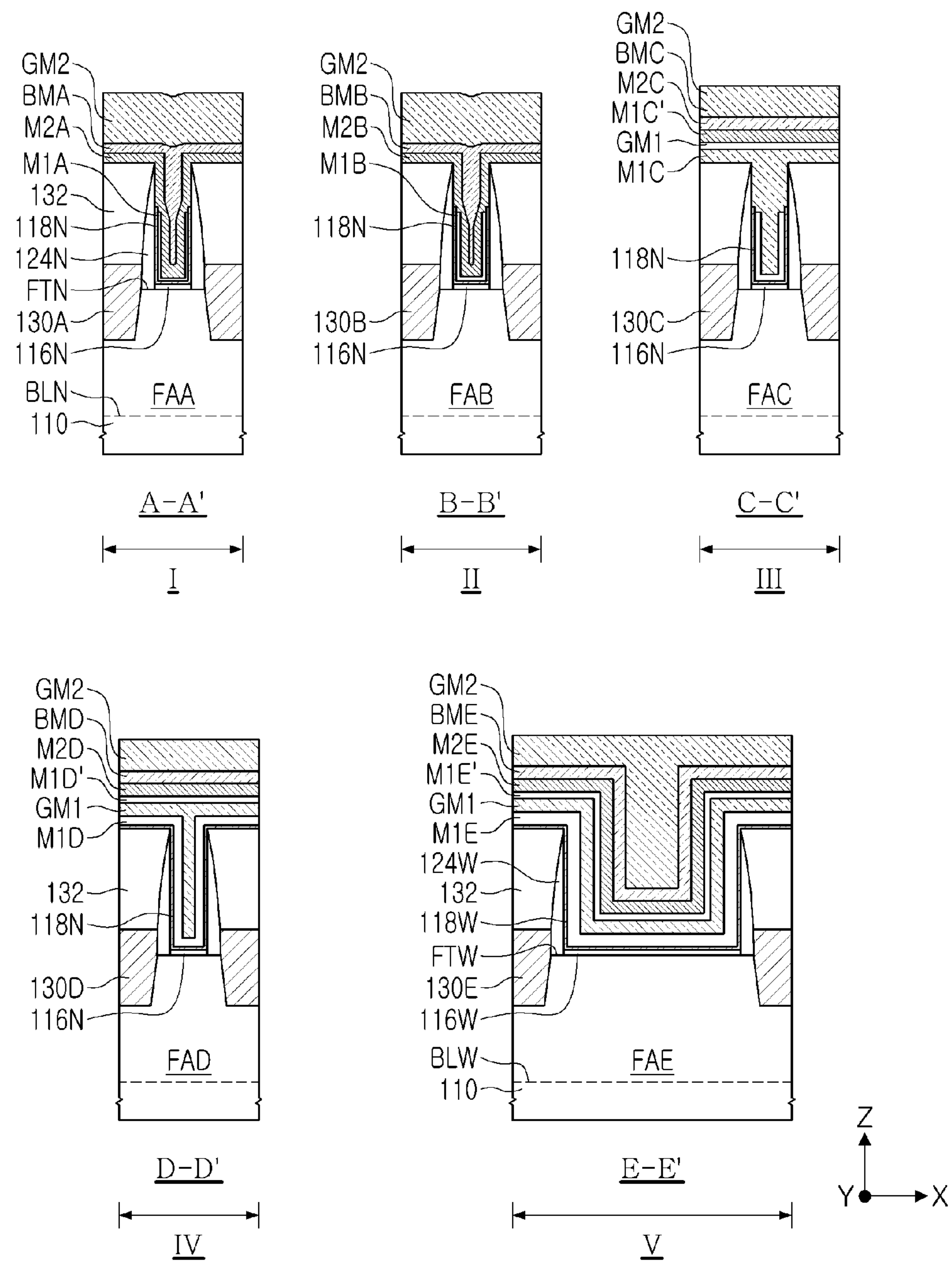

Referring to FIG. 16, first to fifth upper work function layers M2A, M2B, M2C, M2D, and M2E, and first to fifth conductive barrier layer BMA, BMB, BMC, BMD, and BME may be formed in sequence in first to fifth regions I, II, III, IV, and V, respectively.

The first and second upper work function layers M2A and M2B may be formed conformally between first and second lower work function layers M1A, and M1B in first and second gate spaces GHA and GHB in the first and second regions I and II. In the fifth region V, the fifth upper work function layer M2E may be formed conformally to fill a portion of fifth gate space GHE. The first to fifth upper work function layers M2A, M2B, M2C, M2D, and M2E may be formed of TiAl, TiAlC, TiAlN, or a combination thereof.

In each of the first and second regions I and II, the first and second conductive barrier layers BMA and BMB may fill remaining first and second gate spaces GHA and GHB. In the fifth region V, the fifth conductive barrier layer BME may be formed conformally to fill a portion of the fifth gate space GHE. The first to fifth conductive barrier layers BMA, BMB, BMC, BMD, and BME may be formed of a metal nitride, for example, TiN, TaN, or a combination thereof.

A second gap fill metal layer GM2 may be formed on the first to fifth conductive barrier layers BMA, BMB, BMC, BMD, and BME in the first to fifth regions I, II, III, IV, and V. The second gap fill metal layer GM2 may be formed of, for example, tungsten W. In the fifth region V, the second gap fill metal layer GM2 may fill the remaining fifth gate space GHE.

Referring again to FIG. 10, first to fifth gate lines GLA, GLB, GLCa, GLDa, and GLEa and a gate capping layer 134 may be formed in the first to fifth regions I, II, III, IV, and V.

The first to fifth gate lines GLA, GLB, GLCa, GLDa, and GLEa may be formed by a planarization process, such as a CMP in the first to fifth regions I, II, III, IV, and V, by way of removing the second gap fill metal layer GM2 formed on an interlayer insulating film 132, the first to fifth conductive barrier layers BMA, BMB, BMC, BMD, and BME, the first to fifth upper work function layers M2A, M2B, M2C, M2D, and M2E, third to fifth intermediate work function layers M1C', M1D', and M1E', the first gap fill metal layer GM1, and the fourth and fifth lower work function layers M1D and M1E.

A portion of the first to fifth gate lines GLA, GLB, GLCa, GLDa, and GLEa may be removed by an additional etching process in the first to fifth regions I, II, III, IV, and V, to expose upper side portions of first and second insulation spacers 124N and 124W.

The gate capping layer 134 may be formed on the first to fifth gate lines GLA, GLB, GLCa, GLDa, and GLEa.

Figure 17:
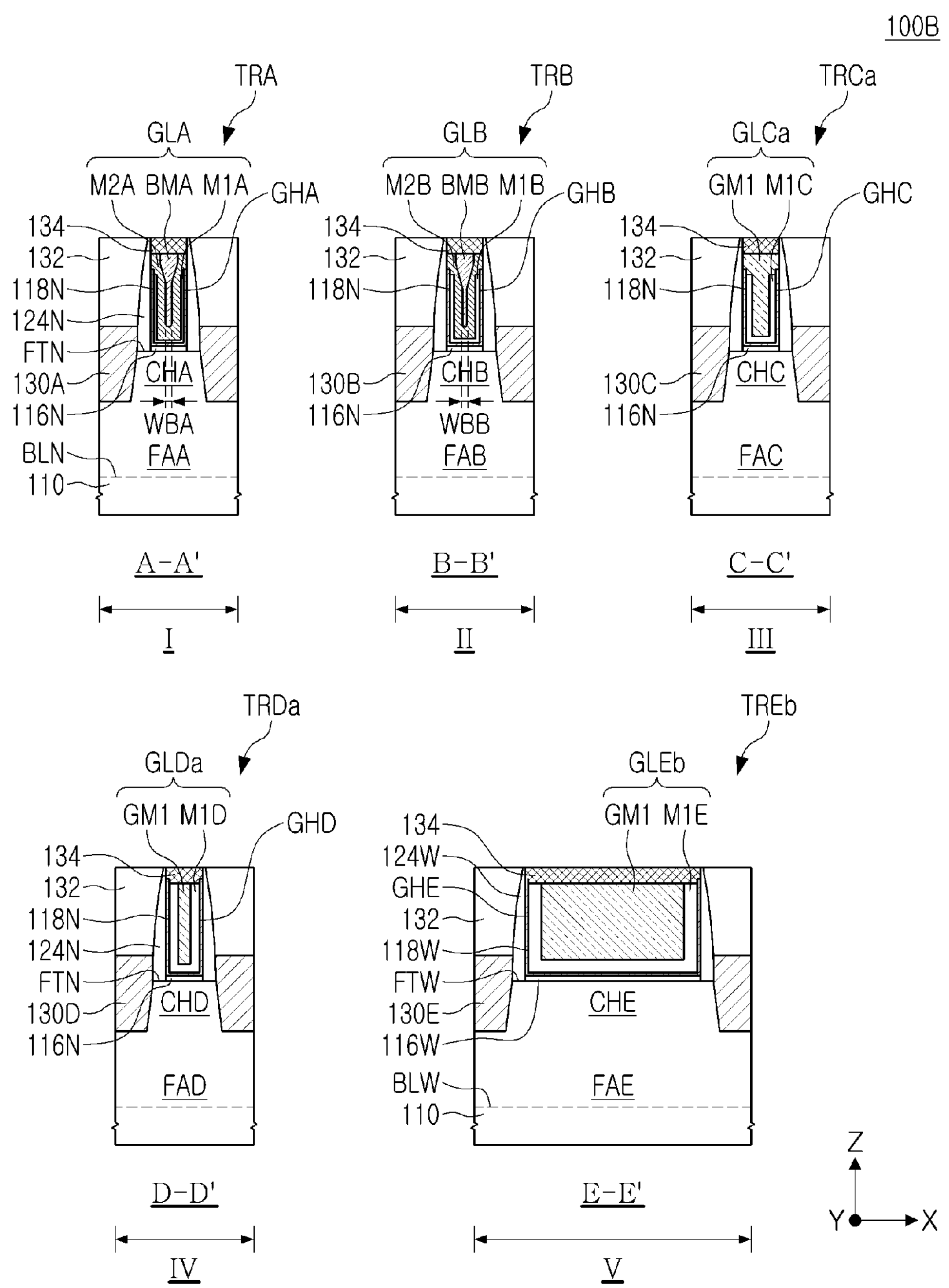
FIG. 17 is a cross-sectional view illustrating a semiconductor device according to an example embodiment of the present inventive concept.

FIG. 17 is a cross-sectional view illustrating a semiconductor device according to an example embodiment of the present inventive concept.

FIG. 17 illustrates cross-sectional views regarding positions corresponding to lines A-A', B-B', C-C', D-D', and E-E' in FIG. 1. In the description of a semiconductor device 100B of FIG. 17, the same parts as those of the semiconductor device 100A of FIG. 10 may be omitted.

The semiconductor device 100B may be the same as the semiconductor device 100A of FIG. 10, except for a fifth gate line GLEb instead of the fifth gate line GLEa of FIG. 10.

The fifth gate line GLEb may be formed of a fifth lower work function layer M1E and a first gap fill metal layer GM1, unlike the fifth gate line GLEa of FIG. 10. The fifth lower work function layer M1E may be formed of, for example, TiN, TaN, W, WCN, or a combination thereof. The first gap fill metal layer GM1 may be made of, for example, tungsten W.

Figure 18:
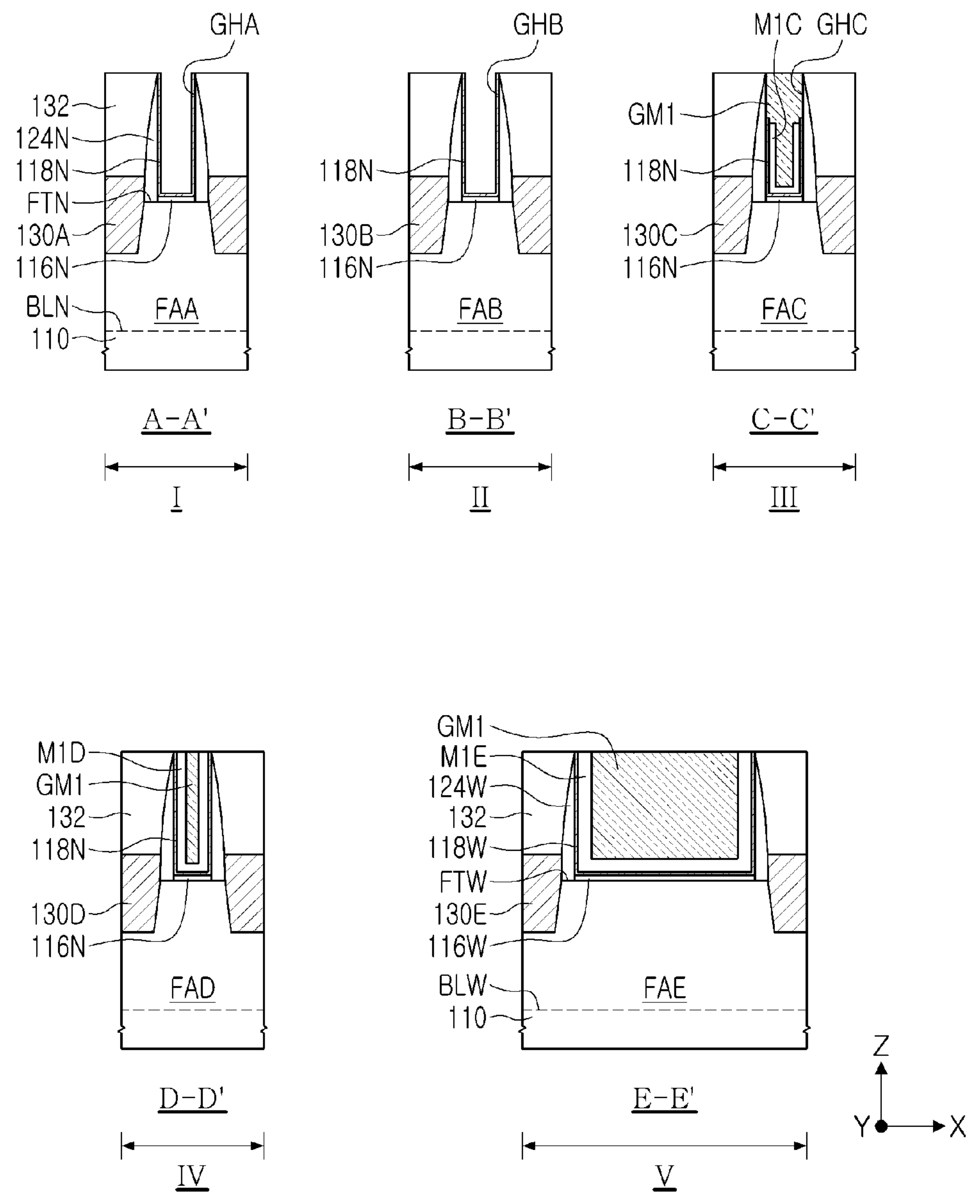
FIG. 18 is a cross-sectional view illustrating a method of manufacturing a semiconductor device according to an example embodiment of the present inventive concept.

FIG. 18 is a cross-sectional view illustrating a method of manufacturing a semiconductor device according to an example embodiment of the present inventive concept. FIG. 18 illustrates cross-sectional views regarding positions corresponding to lines A-A', B-B', C-C', D-D', and E-E' in FIG. 1.

After the process described with reference to FIG. 3 is completed, the processes of FIGS. 11 and 12 may proceed.

Next, referring to FIG. 18, a mask layer (ML in FIG. 12) and a cover layer (CLa in FIG. 12) may be removed by an ashing process and a strip process. Then, a first gap fill metal layer GM1 may be formed on third to fifth lower work function layers M1C, M1D, and M1E in each of first to fifth functional layers I, II, III, IV, and V. In a different manner to FIG. 13, in the fifth region V, the first gap fill metal layer GM1 may be formed on the fifth lower work function layer M1E, and may be formed to completely fill a fifth gate space GHE.

Next, the first gap fill metal layer GM1 formed on an interlayer insulating film 132, fourth and fifth lower work function layers M1D and M1E, and first and second gate insulating layers 118N and 118W may be removed by a planarization process such as CMP. The first gap fill metal layer GM1 and the third lower work function layer M1C may be completely removed by a photolithography process and an etching process in the first and second regions I and II. The etching process may include a wet etching process using a solution containing $H_2O_2$. The solution may include dilute sulfuric peroxide DSP. The etching process may include a dry etching process using an etching gas such as $NF_3$, $NH_3$, or the like. The etching process may be a process in which a wet etching process and a dry etching process are mixed.

Next, the semiconductor device 100B of FIG. 17 may be manufactured by performing subsequent processes as illustrated in FIG. 14 and the like.

The semiconductor device 100, 100A, 100B may be in the form of, for example, a semiconductor chip or die, formed from a semiconductor wafer. The substrate 110 may be formed, for example, from a wafer, such as a silicon wafer.

It is difficult to lower the threshold voltage of the p-type transistor due to the decrease in the width of the gate line due to the scaling down. However, according to the present inventive concept, by removing the n-type work function metal from the gate line constituting the p-type transistor, the p-type transistor having a low threshold voltage may be realized.

According to the present inventive concept, a p-type transistor having a low threshold voltage may be realized without using an additional photo process for selectively removing the n-type work function metal in the gate line constituting the p-type transistor.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

The various and advantageous advantages and effects of the present inventive concept are not limited to the above description, and may be more easily understood in the course of describing a specific embodiment of the present inventive concept.

While example embodiments have been shown and described above, it will be apparent to those skilled in the art that modifications and variations could be made without departing from the scope of the present inventive concept as defined by the appended claims.

What is claimed is:

1. A semiconductor device comprising:

a substrate having a first region and a second region horizontally separate from the first region;

a first gate line in the first region, the first gate line including a first lower work function layer and a first upper work function layer disposed on the first lower work function layer; and a second gate line including a second lower work function layer in the second region, the second gate line having a width in a first; horizontal direction equal to or narrower than a width of the first gate line in the first horizontal direction, wherein an uppermost end of the first upper work function layer and an uppermost end of the second lower work function layer are each located at a vertical level higher than an uppermost end of the first lower work function layer with respect to a second direction perpendicular to the first horizontal direction, wherein the first gate line further comprises a first conductive barrier layer on the first upper work function layer, and wherein an uppermost end of the first conductive barrier layer is at a vertical level higher than the uppermost end of the first upper work function layer.

2. The semiconductor device according to claim 1, wherein the uppermost end of the first upper work function layer is at a vertical level lower than the uppermost end of the second lower work function layer.

3. The semiconductor device according to claim 1, wherein the uppermost end of the first conductive barrier layer is at the same vertical level as the uppermost end of the second lower work function layer.

4. The semiconductor device according to claim 1, further comprising a gate capping layer disposed on the second gate line and formed of an insulating material, wherein a cross-section of the second lower work function layer on a plane perpendicular to an extension direction of the second gate line has a U-shape, and the gate capping layer has a protrusion extending into an internal space of the U-shape of the second lower work function layer.

5. The semiconductor device according to claim 1, wherein a cross-section of the second lower work function layer on a plane perpendicular to an extension direction of the second gate line has a U-shape, and the second gate line further comprises a gap fill metal layer filling an internal space of the U-shape of the second lower work function layer.

6. The semiconductor device according to claim 5, wherein an uppermost end of the gap fill metal layer is located at a vertical level higher than the uppermost end of the first lower work function layer.

7. The semiconductor device according to claim 1, wherein the first and second lower work function layers are formed of a material having a greater work function than the first upper work function layer.

8. The semiconductor device according to claim 1, wherein a thickness of the first lower work function layer is thinner than a thickness of the second lower work function layer.

9. The semiconductor device according to claim 1, further comprising:

a first fin-type active region protruding from the substrate and extending in the first horizontal direction to intersect the first gate line in the first region; and a second fin-type active region protruding from the substrate and extending in the first horizontal direction to intersect the second gate line in the second region, wherein the first fin-type active region is doped with a charge carrier impurity of a first conductivity type, and the second fin-type active region is doped with a charge carrier impurity of a second conductivity type, different from the charge carrier impurity of the first conductivity type.

10. The semiconductor device according to claim 9, wherein the substrate further has a third region horizontally separate from the first and second regions, wherein the semiconductor device further comprises:

a third fin-type active region protruding from the substrate in the third region and doped with the charge carrier impurity of the second conductivity type; and a third gate line extending in the first horizontal direction to intersect the third fin-type active region, having the same width as the first gate line, and including a third lower work function layer and a third upper work function layer on the third lower work function layer, and wherein the uppermost end of the first upper work function layer and an uppermost end of the third upper work function layer are located at a vertical level lower than the uppermost end of the second lower work function layer.

11. The semiconductor device according to claim 10, wherein the first gate line further comprises a first conductive barrier layer on the first upper work function layer, the third gate line further comprises a second conductive barrier layer formed of the same material composition as the first conductive barrier layer on the third upper work function layer, and an uppermost end of the first conductive barrier layer is at a vertical level higher than the uppermost end of the first upper work function layer, and an uppermost end of the second conductive barrier layer is at a vertical level higher than the uppermost end of the third upper work function layer.

12. The semiconductor device according to claim 11, wherein the uppermost end of the first conductive barrier layer and the uppermost end of the second conductive barrier layer are at the same vertical level, and a lowermost end of the first conductive barrier layer is at a vertical level lower than a lowermost end of the second conductive barrier layer.

13. The semiconductor device according to claim 11, wherein the uppermost end of the second conductive barrier layer is at a vertical level higher than the uppermost end of the third upper work function layer.

14. The semiconductor device according to claim 1, wherein the substrate further has a fourth region horizontally separate from the first and second regions, wherein the semiconductor device further comprises:

a fourth gate line in the fourth region, the fourth gate line including a fourth lower work function layer, wherein the width of the first gate line in the first horizontal direction is equal to a width of the fourth gate line in the first horizontal direction, and wherein an uppermost end of the fourth lower work function layer is located at a vertical level higher than the uppermost end of the first lower work function layer.

15. A semiconductor device comprising:

a substrate having a first region and a second region horizontally separate from the first region;

a first gate line disposed in the first region, and including a first gate insulating layer, a first lower work function layer, and a first upper work function layer, stacked in sequence; and a second gate line disposed in the second region, and including a second gate insulating layer and a second lower work function layer, stacked in sequence, wherein the first upper work function layer is disposed to cover an uppermost end of the first lower work function layer, wherein a height of the second gate insulating layer in a direction perpendicular to an upper surface of the substrate is higher than a height of the first gate insulating layer in the direction perpendicular to the upper surface of the substrate, and wherein a height of the second lower work function layer in the direction perpendicular to the upper surface of the substrate is higher than a height of the first lower work function layer in the direction perpendicular to the upper surface of the substrate.

16. The semiconductor device according to claim 15, wherein a height of the first upper work function layer in the direction perpendicular to the upper surface of the substrate is lower than a height of the second lower work function layer in the direction perpendicular to the upper surface of the substrate.

17. The semiconductor device according to claim 15, wherein the first gate line further comprises a first conductive barrier layer on the first upper work function layer, and a height of the first conductive barrier layer in the direction perpendicular to the upper surface of the substrate is higher than a height of the first upper work function layer in the direction perpendicular to the upper surface of the substrate.

18. The semiconductor device according to claim 15, further comprising a gate capping layer disposed on the second gate line and formed of an insulating material, wherein a cross-section of the second lower work function layer on a plane perpendicular to an extension direction of the second gate line has a U-shape, and the gate capping layer has a protrusion extending into an internal space of the U-shape of the second lower work function layer.

19. The semiconductor device according to claim 15, wherein a cross-section of the second lower work function layer on a plane perpendicular to an extension direction of the second gate line has a U-shape, the second gate line further comprises a gap fill metal layer filling an internal space of the U-shape of the second lower work function layer, and an uppermost end of the gap fill metal layer is located at a level higher than the uppermost end of the first lower work function layer with respect to the upper surface of the substrate.

20. A semiconductor device comprising:

a substrate having a first region and a second region horizontally separate from the first region;

a first gate line in the first region, the first gate line including a first lower work function layer and a first upper work function layer disposed on the first lower work function layer;

a second gate line including a second lower work function layer in the second region, the second gate line having a width in a first direction equal to or narrower than a width of the first gate line in the first direction; and a gate capping layer disposed on the second gate line and formed of an insulating material, wherein each of an uppermost end of the first upper work function layer and an uppermost end of the second lower work function layer is at a level higher than an uppermost end of the first lower work function layer with respect to a second direction perpendicular to the first direction, and wherein the gate capping layer has a protrusion filling an internal space of the second lower work function layer.

* * * * *